US012595622B2

(12) United States Patent
Choi et al.

(10) Patent No.: US 12,595,622 B2
(45) Date of Patent: Apr. 7, 2026

(54) FABRIC SUBSTRATE AND MANUFACTURING METHOD THEREOF

(71) Applicant: Korea Advanced Institute of Science and Technology, Daejeon (KR)

(72) Inventors: Kyung Cheol Choi, Daejeon (KR); Seung Yeop Choi, Daejeon (KR); Seon Il Kwon, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 23 days.

(21) Appl. No.: 18/610,450

(22) Filed: Mar. 20, 2024

(65) Prior Publication Data

US 2024/0218592 A1     Jul. 4, 2024

Related U.S. Application Data

(62) Division of application No. 16/683,714, filed on Nov. 14, 2019, now abandoned.

(30) Foreign Application Priority Data

Nov. 14, 2018     (KR) ......................... 10-2018-0139958
Oct. 29, 2019     (KR) ......................... 10-2019-0135190

(51) Int. Cl.
D06N 3/18          (2006.01)
D06N 3/00          (2006.01)
(Continued)

(52) U.S. Cl.
CPC ............. D06N 3/18 (2013.01); D06N 3/0006 (2013.01); D06N 3/0081 (2013.01); D06N 3/042 (2013.01);
(Continued)

(58) Field of Classification Search
CPC .............................. H10K 77/111; H10K 71/80
See application file for complete search history.

(56) References Cited

U.S. PATENT DOCUMENTS

2011/0250392 A1     10/2011  Woody et al.
2012/0274239 A1*    11/2012  Endo .................... H10K 71/233
                                                                         438/46
(Continued)

FOREIGN PATENT DOCUMENTS

CN          108054291 A       5/2018
JP          2014001341 A      1/2014
(Continued)

OTHER PUBLICATIONS

Ash et al., "Handbook of Textile Processing Chemicals—Dimethylsiloxane". Synapse Information Resources, Inc., 2013, retrieved from <https://app.knovel.com/hotlink/pdf/id:kt00C0RFJ1/handbook-textile-processing/dimethylsiloxane>.

*Primary Examiner* — Alex A Rolland
(74) *Attorney, Agent, or Firm* — The Webb Law Firm

(57)          ABSTRACT

According to the present invention, there is provided a fabric substrate for mounting a light emitting element. The fabric substrate comprises a fabric layer including at least one fabric, a stress buffer layer that is disposed on the fabric layer and minimizes an occurrence of physical strain and stress caused by bending the fabric layer, and a flattening layer that is disposed on the stress buffer layer and provides a flat surface to allow a light emitting element to operate.

7 Claims, 25 Drawing Sheets

<u>100</u>

(51) Int. Cl.

| | |
|---|---|
| *D06N 3/04* | (2006.01) |
| *D06N 3/12* | (2006.01) |
| *D06N 3/14* | (2006.01) |
| *G09F 21/02* | (2006.01) |
| *H10K 71/80* | (2023.01) |
| *H10K 77/10* | (2023.01) |

(52) U.S. Cl.
CPC ............. *D06N 3/123* (2013.01); *D06N 3/128* (2013.01); *D06N 3/14* (2013.01); *G09F 21/026* (2013.01); *H10K 71/80* (2023.02); *H10K 77/111* (2023.02); *D06N 2203/045* (2013.01); *D06N 2203/061* (2013.01); *D06N 2203/068* (2013.01); *D06N 2205/20* (2013.01); *D06N 2207/123* (2013.01); *D06N 2209/106* (2013.01); *D06N 2209/1635* (2013.01)

(56) References Cited

U.S. PATENT DOCUMENTS

2013/0043065 A1* 2/2013 Park ..................... H05K 3/4682
156/247

2015/0314326 A1* 11/2015 Park ....................... D06C 15/00
264/447
2016/0064696 A1* 3/2016 Collier ................. H10K 50/856
428/161
2016/0174304 A1 6/2016 Kim et al.
2016/0212822 A1 7/2016 Kim

FOREIGN PATENT DOCUMENTS

| | | | |
|---|---|---|---|
| KR | 1020130019289 | A | 2/2013 |
| KR | 101402743 | B1 | 6/2014 |
| KR | 20140069443 | A | 6/2014 |
| KR | 101426885 | B1 | 8/2014 |
| KR | 1020140130581 | A | 11/2014 |
| KR | 1020160088489 | A | 7/2016 |
| KR | 1020170012070 | A | 2/2017 |
| KR | 1020180086012 | A | 7/2018 |
| WO | 2015099238 | A1 | 7/2015 |

* cited by examiner

100

130
120
110

100

130
120

110

310

320

310

330
320

310

FIG. 3F 350
340
330
DI WATER
310

DI WATER

400

430
420
410

400

430
420

410

<PHOTOLITHOGRAPHY PROCESS>

FIRST UV CURING

FIG. 6G

<PHOTOLITHOGRAPHY PROCESS>

FABRIC SUBSTRATE AND MANUFACTURING METHOD THEREOF

CROSS-REFERENCE TO RELATED APPLICATIONS

This application is a divisional of U.S. patent application Ser. No. 16/683,714, filed Nov. 14, 2019, which claims priority to Korean Patent Application No. 10-2018-0139958 filed on Nov. 14, 2018 and Korean Patent Application No. 10-2019-0135190 filed on Oct. 29, 2019, the disclosures of which are hereby incorporated by reference in their entireties.

BACKGROUND OF THE INVENTION

Field of the Invention

The present invention relates to a fabric substrate and a manufacturing method thereof, and more particularly, to a fabric substrate having a very low surface roughness and an excellent interface property and a manufacturing method thereof.

Description of Related Art

As the next generation display technology, various displays such as a flexible display and a wearable display have been researched. Although various research results using flexible substrates such as a polyimide (PI) film, a polyester film, thin glass, and a glass fiber sheet have been reported for the flexible display, the wearable display is still in an early research stage, and many research results have not been obtained.

As a manufacturing method of the wearable display, which has been currently reported, a method in which a fabric itself emits light, for example, by adding an optical fiber or an electroluminescent (EL) wire to a fabric, or a method in which a fabric substrate is manufactured by binding polymers to the upper portion of a fabric and flattening the fabric, and then a light emitting element is formed on the upper portion of the obtained fabric substrate are provided.

The wearable display using the fabric substrate has advantages of low cost and a relatively simple manufacturing process. However, the wearable display using a fabric substrate in the related art is configured by binding polymers to the entire surface of a fabric and flattening the fabric. Accordingly, this wearable display is flexible, but has large physical strain and large stress. Thus, the wearable display in the related art has a problem that it is difficult to achieve a foldable or stretchable property.

For the wearable display using a fabric substrate in the related art, a method of coating fabric with a solution or a method of bonding a plastic substrate to the fabric by thermocompression is used for operating a light emitting element on the fabric. However, the former method has a problem that it is difficult to sufficiently smooth the rough surface of the fabric, and thus the light emitting element does not operate stably, and the latter method has a problem in that the plastic substrate and the fabric are deformed by heat, and thus selection of the materials has significant limitations.

BRIEF SUMMARY OF THE INVENTION

An object of the present invention is to solve the above-described problems and other problems. Another object thereof is to provide a fabric substrate having a very low surface roughness and an excellent interface property and a manufacturing method thereof.

Still another object thereof is to provide a fabric substrate in which heat is not applied to the fabric, and thus it is possible to maintain flexibility of the fabric without an occurrence of strain by heat, and a manufacturing method thereof.

Yet another object thereof is to provide a fabric substrate in which it is possible to minimize an occurrence of physical strain and internal stress, and a manufacturing method thereof.

Still yet another object thereof is to provide a fabric substrate and a manufacturing method thereof in which mass production with low cost is possible based on a solution process under conditions of predetermined pressure and/or temperature.

Another further object thereof is to provide a fabric substrate having excellent breathability, elasticity, and flexibility, and a manufacturing method thereof.

To achieve the above or other objects, an exemplary embodiment of the present invention provides a fabric substrate including a fabric layer including at least one fabric, a stress buffer layer that is disposed on the fabric layer and minimizes an occurrence of physical strain and stress caused by bending the fabric layer, and a flattening layer that is disposed on the stress buffer layer and provides a flat surface to allow a light emitting element to operate.

Preferably, the stress buffer layer is formed of a material having elasticity and adhesiveness. In addition, the stress buffer layer is formed of a material having a Young's modulus of 500 MPa or less. In addition, the stress buffer layer is formed to have a thickness of 0.1 μm or more. In addition, the stress buffer layer is formed of a silicon-based material capable of being cured at room temperature.

More preferably, the flattening layer is formed of a material which has a surface roughness of several nanometers (nm) or less and an interface property suitable for forming a thin film. In addition, the flattening layer is formed of a material having a Young's modulus of 0.1 GPa or more. In addition, the flattening layer is formed to have a thickness of 30 μm or less. In addition, the flattening layer contains at least one of photocurable epoxy resin (SU-8), polyethylenenaphthalate (PEN), polyimide (PI), polyethylene terephthalate (PET), polyvinyl alcohol (PVA), acrylate, polyurethane, and polydimethylsiloxane.

More preferably, at least one of the stress buffer layer and the flattening layer is formed of a UV curable material. In addition, at least one of the stress buffer layer and the flattening layer includes multiple openings corresponding to a fabric-like pattern.

Another exemplary embodiment of the present invention provides a manufacturing method of a fabric substrate including disposing a sacrificial layer on a support substrate and disposing a flattening layer on the sacrificial layer, disposing a stress buffer layer on the flattening layer, disposing a fabric layer on the stress buffer layer, and applying predetermined pressure in a direction of the fabric layer, and generating a fabric substrate in which the flattening layer, the stress buffer layer, and the fabric layer are sequentially stacked, by removing the sacrificial layer disposed between the support substrate and the flattening layer.

More preferably, the manufacturing method of a fabric substrate further includes washing a contaminant on a surface of the support substrate. In addition, the manufacturing method of a fabric substrate further includes hardening the stress buffer layer at room temperature for a predetermined time.

More preferably, in the disposing of the sacrificial layer, the sacrificial layer is stacked by a predetermined coating process, and the sacrificial layer is cured by being heated at a predetermined temperature for a predetermined time. In addition, in the disposing of the flattening layer, the flattening layer is stacked by a predetermined coating process, and the flattening layer is cured by being heated at a predetermined temperature for a predetermined time or by being irradiated with a UV ray having a predetermined wavelength for a predetermined time.

More preferably, in the generating of the fabric substrate, the sacrificial layer is removed by a predetermined solvent. Here, the sacrificial layer is formed of a material which is freely soluble in a solvent.

More preferably, the manufacturing method of a fabric substrate further includes forming a metal pattern layer having a reversed pattern of a fabric-like pattern, between the support substrate and the sacrificial layer by a photolithography process. In addition, the manufacturing method of a fabric substrate further includes curing a portion of the flattening layer and the stress buffer layer by irradiation with UV rays in a direction of a lower surface of the support substrate, and selectively etching a portion of the flattening layer and the stress buffer layer, in which UV curing is not caused, with a developer.

Effects of the fabric substrate and the manufacturing method thereof according to the exemplary embodiments of the present invention are as follows.

According to at least one exemplary embodiment of the present invention, the surface roughness is very low, and the interface property is excellent, and thus it is possible to form and operate various thin-film light emitting elements.

According to at least one exemplary embodiment of the present invention, since heat is not directly applied to the fabric in a process of manufacturing the fabric substrate, strain by heat does not occur, and thus the exemplary embodiment can be applied to all fabrics.

According to at least one exemplary embodiment of the present invention, since the substrate has flexibility similar to that of a fabric, it is possible to wrinkle the substrate in various directions like actual clothing, and to operate the light emitting element even after a predetermined number of times of repetitive bending.

According to at least one exemplary embodiment of the present invention, functionality and breathability similar to those of a fabric are imparted, and thus it is possible to provide a comfortable and cool fit like actual clothes.

The effects which can be achieved by the fabric substrate and the manufacturing method thereof according to the exemplary embodiments of the present invention are not limited to those mentioned above, and other effects which are not mentioned above may be clearly understood by those skilled in the art from the following descriptions.

BRIEF DESCRIPTION OF THE DRAWINGS

FIGS. 3A to 3G are diagrams illustrating a manufacturing method of the fabric substrate according to an exemplary embodiment of the present invention.

FIGS. 6A to 6G are diagrams illustrating a manufacturing method of a fabric substrate according to another exemplary embodiment of the present invention.

FIGS. 9A to 9G are diagrams illustrating a manufacturing method of a fabric substrate according to yet another exemplary embodiment of the present invention.

DETAILED DESCRIPTION OF THE INVENTION

Figure 1A:
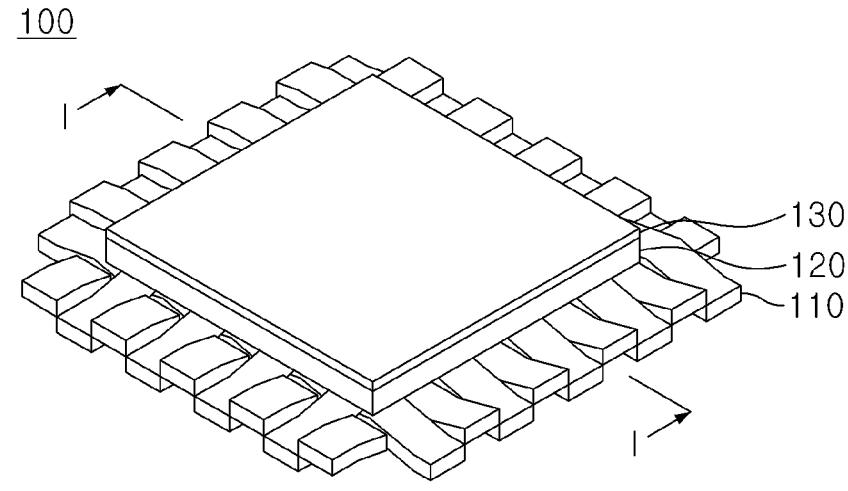
FIG. 1A is a perspective view illustrating a fabric substrate according to an exemplary embodiment of the present invention.

Hereinafter, exemplary embodiments disclosed in this specification will be described in detail with reference to the accompanying drawings. The same or similar components are denoted by the same reference signs for all reference signs, and repetitive descriptions thereof will be omitted. In the following descriptions of exemplary embodiments according to the present invention, in a case where a description that a layer (film), a region, a pattern, or a structure is formed "on" or "under" a substrate, a layer (film), a region, a pad, or a pattern is made, "on" and "under" include a case of directly forming or (indirectly) forming with another layer interposed therebetween. In addition, the criteria for being on or under a layer will be described based on the drawings. In the drawings, for easy and clear descriptions, the thickness or the size of each layer are illustrated with being exaggerated or omitted, or are schematically illustrated. In addition, the size of each component does not necessarily reflect the actual size.

In describing the exemplary embodiments disclosed here, if it is determined that the detailed descriptions of the related known technology may obscure the gist of the exemplary embodiments herein, the detailed description thereof will be omitted. In addition, the accompanying drawings are only for easily understanding the exemplary embodiments disclosed herein, the technical spirit disclosed in the specification are not limited by the accompanying drawings, and all changes, equivalents, and substitutes are included in the spirit and scope of the present invention.

According to the present invention, a fabric substrate having a very low surface roughness and an excellent interface property, and a manufacturing method thereof are provided. In addition, according to the present invention, a fabric substrate in which heat is not applied to a fabric, and thus it is possible to maintain flexibility of the fabric without an occurrence of strain by heat, and a manufacturing method thereof are provided. In addition, according to the present invention, a fabric substrate in which it is possible to minimize an occurrence of physical strain and internal stress, and a manufacturing method thereof are provided. In addition, according to the present invention, a fabric substrate and a manufacturing method thereof in which mass production with low cost is possible based on a solution process under conditions of predetermined pressure and/or temperature is provided. In addition, according to the present invention, a fabric substrate having excellent breathability, elasticity, and flexibility, and a manufacturing method thereof are provided.

The term "fabric" described in the specification refers to a fabric being a plane sifter which is obtained by vertically interlacing and interweaving a warp yarn and a weft yarn, and has a predetermined area, as defined by a dictionary definition. However, "the fabric" defined in the specification includes all kinds of fabrics such as synthetic fibers, recycled fibers, natural fibers, cotton, polyester, leather, and linens, in addition to woven fabrics in a dictionary sense.

Various exemplary embodiments of the present invention will be described below with reference to the drawings.

Figure 1B:
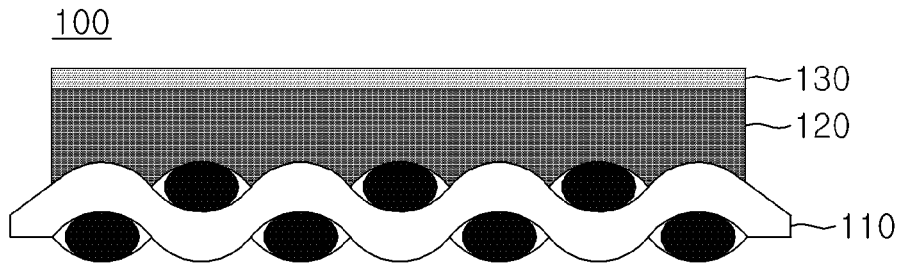
FIG. 1B is a cross-sectional view of the fabric substrate taken along line I-I in FIG. 1A.

FIG. 1A is a perspective view illustrating a fabric substrate according to an exemplary embodiment of the present invention. FIG. 1B is a cross-sectional view of the fabric substrate taken along line I-I in FIG. 1A.

With reference to FIGS. 1A and 1B, according to an exemplary embodiment of the present invention, a fabric substrate 100 may include a fabric layer 110, a stress buffer layer 120 on the fabric layer 110, and a flattening layer 130 on the stress buffer layer 120.

The fabric layer 110 is under the stress buffer layer 120 and the flattening layer 130 and may have a function to support the stress buffer layer 120 and the flattening layer 130.

The fabric layer 110 is configured with at least one fabric. The fabric layer 110 may include, for example, all kinds of fabrics such as synthetic fibers, recycled fibers, natural fibers, cotton, polyester, leather, and linens. According to the present invention, all kinds of fabrics can be used as the fabric substrate 100 because heat is not applied to the fabric in a manufacturing process, and thus strain by heat does not occur.

The stress buffer layer (or coalescent layer, 120) is disposed on the fabric layer 110. At this time, the stress buffer layer 120 may be formed by at least one method of spin coating, bar coating, dip coating, and lamination.

The stress buffer layer 120 disposed on the fabric layer 110 may be slowly hardened under conditions of predetermined pressure and/or temperature, when a predetermined time elapsed. That is, in the stress buffer layer 120, a liquid substance having high viscosity is slowly hardened by moisture in the atmosphere, and is changed into a solid material such as rubber, which is very flexible and elastic.

The stress buffer layer 120 may function to minimize an occurrence of physical strain and internal stress caused by repetitively bending the fabric layer 110. In addition, the stress buffer layer 120 may function to cause the fabric layer 110 and the flattening layer 130 to firmly adhere to each other. For this, the stress buffer layer 120 may be formed of a material having elasticity and adhesiveness.

The stress buffer layer 120 may be formed of a material having a Young's modulus of 500 MPa or less in order to minimize the occurrence of stress in the fabric substrate 100 and to secure flexibility of the fabric substrate 100. In addition, the stress buffer layer 120 may be formed of a material having elasticity as large as physical breakdown does not occur even at strain of 1% or more. In addition, the stress buffer layer 120 may be formed of a material which is highly flexible and elastic, such that the strain occurring in the fabric layer 110 is not transferred to the flattening layer 130.

The stress buffer layer 120 may be formed of a material which may be hardened under atmospheric pressure or room temperature, in order not to directly apply heat to a fabric in manufacturing a fabric substrate. Representatively, a silicon (Si) based material may be used for such a stress buffer layer 120. As an example, a polydimethylsiloxane (PDMS) based silicon material may be used for the stress buffer layer 120, and the exemplary embodiment is not necessarily limited thereto.

The stress buffer layer 120 may be formed to have a thickness of 0.1 μm to 100 μm, preferably, a thickness of 1 μm to 10 μm such that it is possible to minimize the occurrence of strain in the fabric substrate 100, and to secure sufficient adhesion power.

The flattening layer 130 may be disposed on the stress buffer layer 120. At this time, the flattening layer 130 may be formed by at least one method of spin coating, bar coating, dip coating, and lamination.

The flattening layer 130 disposed on the stress buffer layer 120 may be cured by applying heat at a predetermined temperature for a predetermined time. Meanwhile, as another example, the flattening layer 130 may be cured by being irradiated with a UV ray having a predetermined wavelength for a predetermined time.

Generally, threads constituting fabric are made of several strands of fiber, and thus the surface of the fabric is rough in many cases. Thus, flattening is mostly required for stacking a light emitting element on the fabric.

The flattening layer 130 may function to improve smoothness of the fabric substrate 100. That is, the flattening layer 130 may provide a flat surface allowing a light emitting element to grow by a thin film vapor deposition process. In addition, the flattening layer 130 may provide a flat surface allowing the light emitting element to normally operate. For this, the flattening layer 130 may be formed of a material which has a surface roughness which is several nanometers (nm) or less and is similar to those of glass, and an interface property suitable for forming a thin film.

The flattening layer 130 may be formed of a material having a Young's modulus of 0.1 GPa or more in order to minimize the occurrence of strain in the light emitting element mounted on the surface of the flattening layer. As an example, the flattening layer 130 may be formed of carbon-based polymers such as photocurable epoxy resin (SU-8), polyethylenenaphthalate (PEN), polyimide (PI), polyethylene terephthalate (PET), polyvinyl alcohol (PVA), acrylate, polyurethane, and polydimethylsiloxane. The material of the flattening layer is not necessarily limited thereto.

The flattening layer 130 may be formed to have a thickness of 50 μm or less, preferably, a thickness of 30 μm or less, such that a thin film as the flattening layer can be formed on the stress buffer layer 120.

As described above, an electroluminescence fabric may be configured in a manner that one or more light emitting elements (not illustrated) are mounted on the fabric substrate 100 formed by sequentially stacking the fabric layer 110, the stress buffer layer 120, and the flattening layer 130.

Figure 2A:
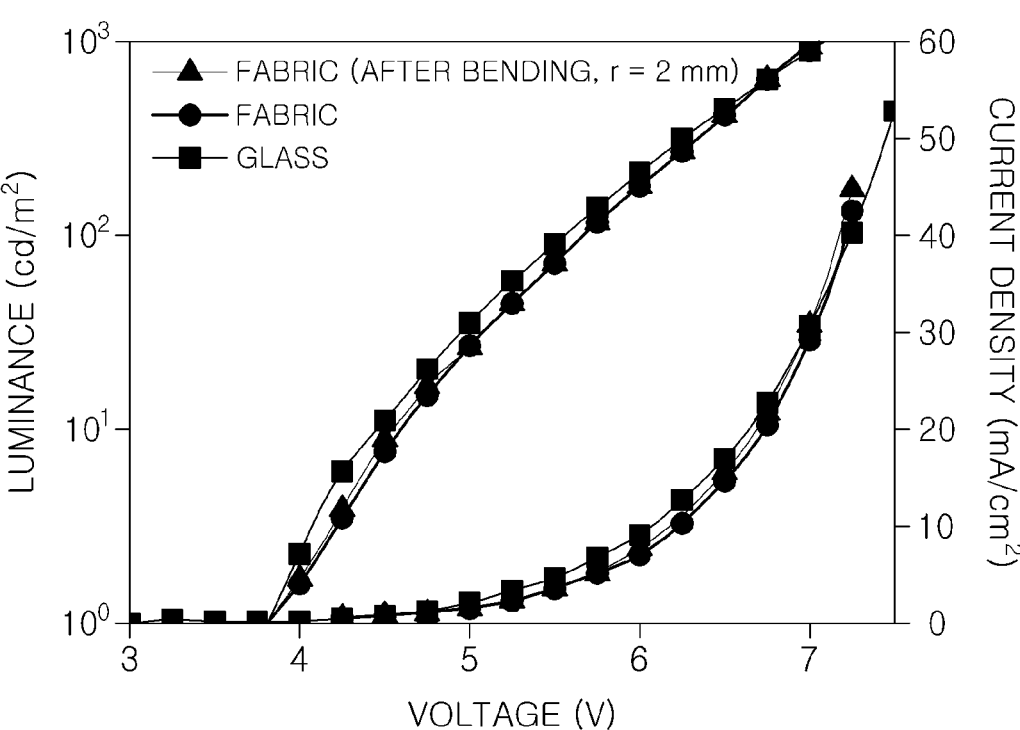
FIGS. 2A and 2B are diagrams illustrating electro-optical characteristics of a light emitting element in accordance with a type of substrate and whether or not a bending test is performed on the fabric substrate.
Figure 2B:
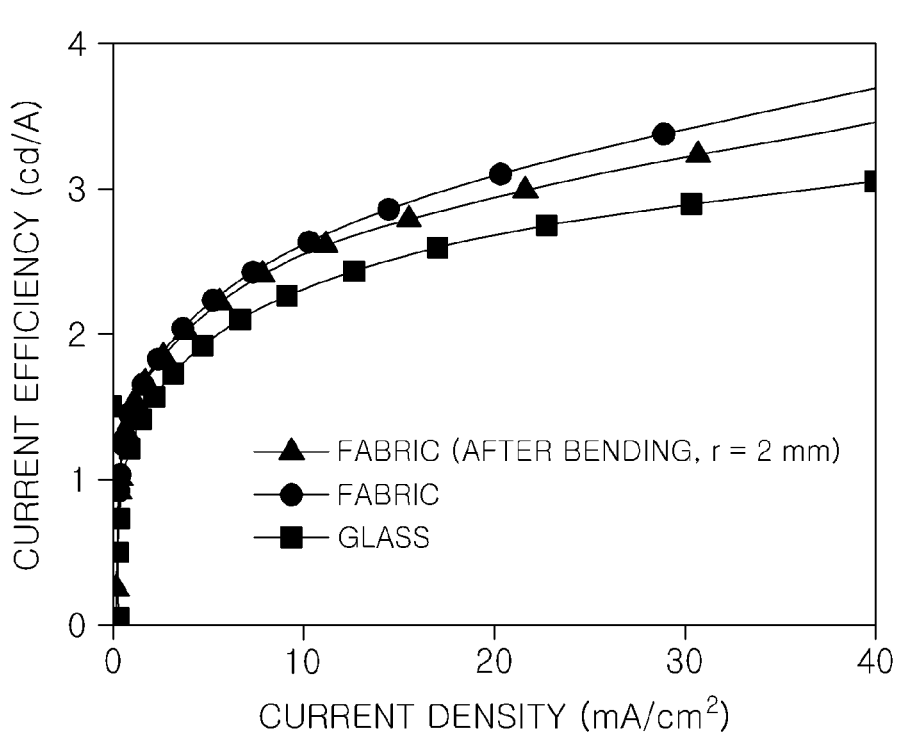

FIG. 2 is a diagram illustrating electro-optical characteristics of the light emitting element in accordance with a type of substrate and whether or not a bending test is performed on the fabric substrate.

FIG. 2 illustrates a graph obtained by simulating electro-optical characteristics of a light emitting element mounted on a glass substrate, a graph obtained by simulating electro-optical characteristics of a light emitting element mounted on a fabric substrate, and a graph obtained by simulating electro-optical characteristics of a light emitting element after a bending test is performed, a predetermined number of times or more, on a fabric substrate on which the light emitting element is mounted, with a predetermined bending radius.

For the electro-optical characteristics of the light emitting element, which have been measured by the simulations, luminance with a change of a voltage, current density with a change of a voltage, and current efficiency with a change of current density are provided. The performance of the light emitting element can be recognized by comparison of the electro-optical characteristics.

As illustrated in FIG. 2, the electro-optical characteristics of the light emitting element mounted on the glass substrate are not largely different from the electro-optical characteristics of the light emitting element mounted on the fabric substrate. Thus, it is possible to recognize that it is possible to recognize that the fabric substrate according to the present invention can stably operate the light emitting element and maintain the performance of the light emitting element, similar to the glass substrate. In addition, the electro-optical characteristics of the light emitting element mounted on the fabric substrate is not largely different from the electro-optical characteristics of the light emitting element after a predetermined bending test is performed on the fabric substrate in which the light emitting element is mounted. Thus, it is possible to recognize that it is possible to stably operate the light emitting element and to maintain the performance of the light emitting element because of high durability of the fabric substrate even though the fabric substrate according to the present invention is repetitively bent with a predetermined bending radius a predetermined number of times or more.

FIGS. 3A to 3G are diagrams illustrating a manufacturing method of the fabric substrate according to the exemplary embodiment of the present invention.

Figure 3A:
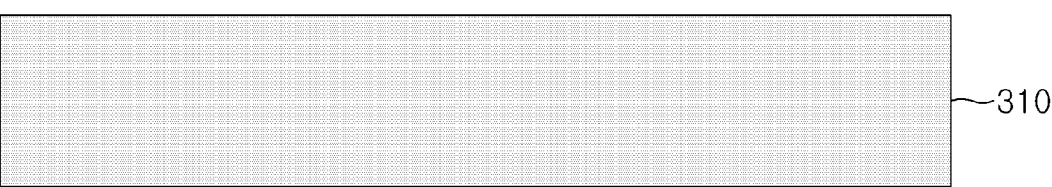

With reference to FIG. 3A, a support substrate 310 having predetermined size and thickness may be prepared. At this time, a flat substrate such as a glass substrate, a quartz substrates, a plastic substrates, a wafer, and the like can be used as the support substrate 310.

Then, a contaminant on the surface of the support substrate 310 may be removed with a washing solution. DI water may be used as the washing solution, and the exemplary embodiment is not necessarily limited thereto.

Figure 3B:
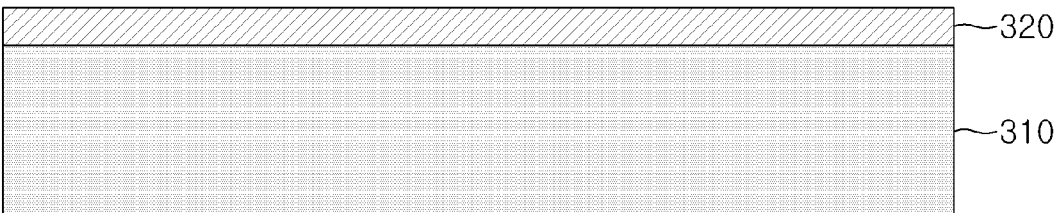

With reference to FIG. 3B, a sacrificial layer 320 may be stacked on the support substrate 310 with a spin coating process under conditions of predetermined pressure and/or temperature. Then, the sacrificial layer 320 may be firmly cured by applying heat at a predetermined temperature for a predetermined time. At this time, the sacrificial layer 320 may be formed on the support substrate 310 to have a thickness of 0.01 μm or more.

The sacrificial layer 320 stacked on the support substrate 310 may be formed of a material which is freely soluble in a solvent. As an example, the sacrificial layer 320 may be formed with polyvinyl alcohol (PVA), copper (Cu), or polymethyl methacrylate (PMMA). In a case where the sacrificial layer 320 is formed with polyvinyl alcohol, DI water may be used as a solvent for dissolving the sacrificial layer. In a case where the sacrificial layer 320 is formed with copper, a Cu etchant may be used as the solvent for dissolving the sacrificial layer. In a case where the sacrificial layer 320 is formed with PMMA, isopropyl alcohol (IPA) may be used as the solvent for dissolving the sacrificial layer. In the exemplary embodiment, as an example, a case where the sacrificial layer is formed with polyvinyl alcohol will be described below.

Figure 3C:
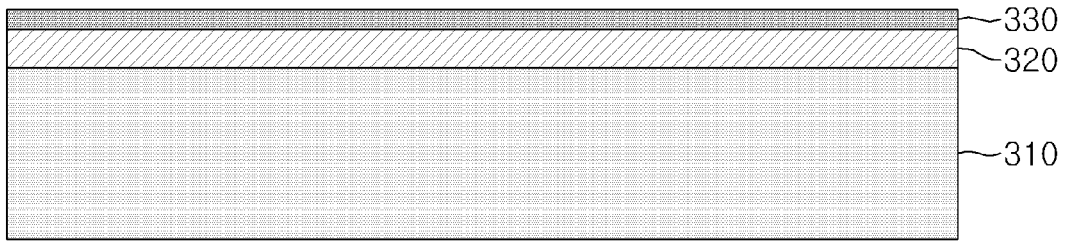

With reference to FIG. 3C, flattening layer 330 may be stacked on the sacrificial layer 320 with a spin coating process under conditions of predetermined pressure and/or temperature. Then, the flattening layer 330 may be firmly cured by applying heat at a predetermined temperature for a predetermined time or by being irradiated with a UV ray having a predetermined wavelength for a predetermined time. At this time, the flattening layer 330 may be formed on the sacrificial layer 320 to have a thickness of 30 μm or less.

The flattening layer 330 may be formed of a material having a Young's modulus of 0.1 GPa or more. As an example, the flattening layer 330 may be formed of a photocurable epoxy resin (SU-8) material.

Figure 3D:
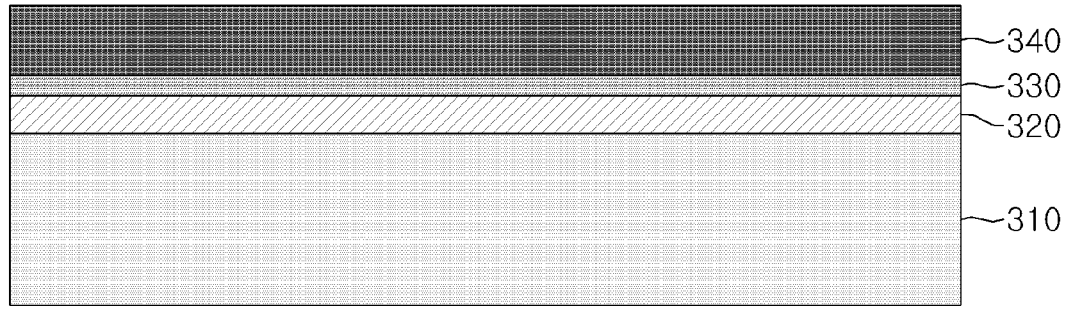
Figure 3E:
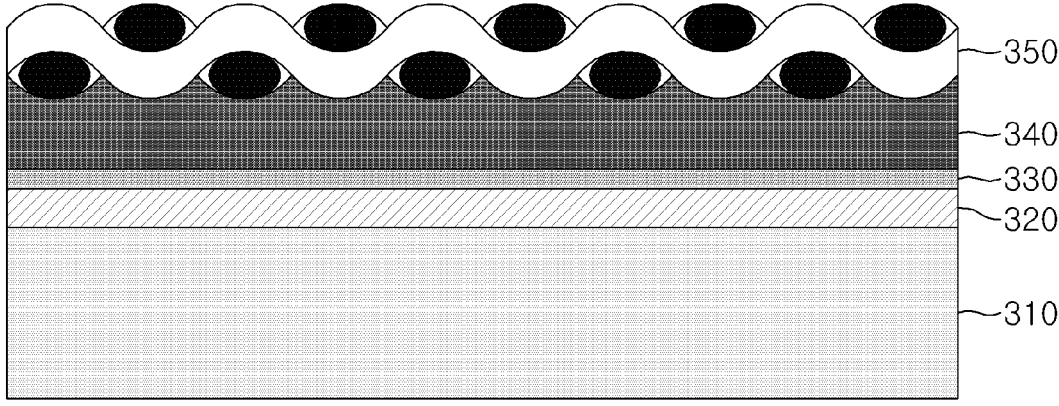
Figure 3F:
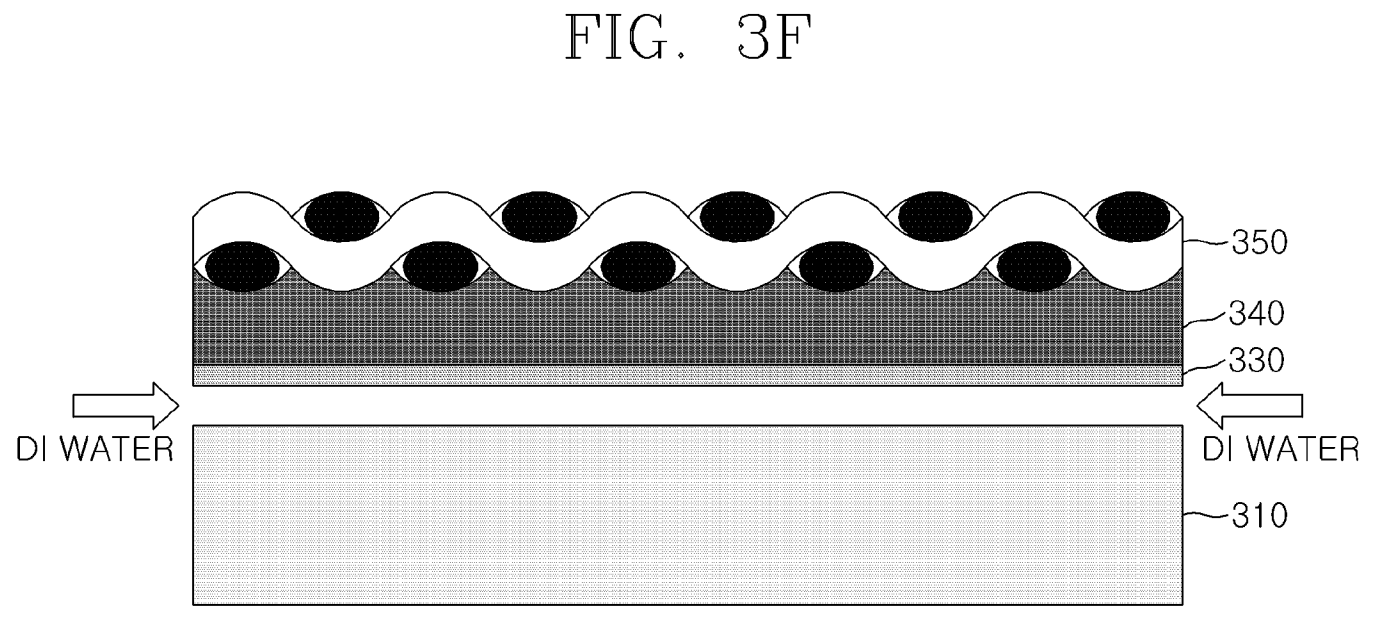
Figure 3G:
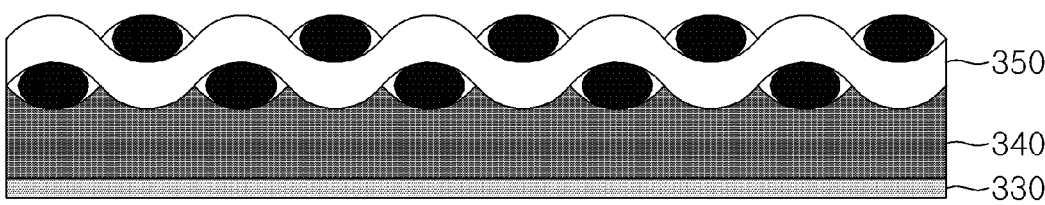

With reference to FIGS. 3D and 3E, a stress buffer layer 340 may be stacked on the flattening layer 330 with a spin coating process under conditions of predetermined pressure and/or temperature.

Then, a fabric layer (or fabric, 350) may be stacked on the stress buffer layer 340 with a lamination process. That is, the fabric layer 350 is disposed on the stress buffer layer 340, and then predetermined pressure is applied in a direction of the fabric layer 350 for a predetermined time. This is because the stress buffer layer 340 in a liquid state is caused to be absorbed to the fabric layer 350 so as to improve an adhesive force. In such a state, the stress buffer layer 340 is hardened under a condition of atmospheric pressure or room temperature when a predetermined time elapsed. Thus, the stress buffer layer 340 may cause the flattening layer 330 and the fabric layer 350 to be firmly bound to each other (firmly adhere to each other).

The stress buffer layer 340 may be formed on the flattening layer 330 to have a thickness of 0.1 μm or more, preferably, a thickness of 1 μm tp 10 μm. In addition, the stress buffer layer 340 may be formed of a material having a Young's modulus of 500 MPa or less. As an example, the stress buffer layer 340 may be formed of a PDMS-based silicone material.

In a case of the above stacking process, the stress buffer layer 340 located under the fabric layer 350 is hardened at room temperature. Thus, all kinds of fabrics such as synthetic fibers, recycled fibers, natural fibers, cotton, polyester, leather, and linens may be used for the fabric substrate.

With reference to FIGS. 3E and 3F, a substrate structure in which the support substrate 310, the sacrificial layer 320, the flattening layer 330, the stress buffer layer 340, and the fabric layer 350 are sequentially stacked may be immersed in a predetermined solvent. At this time, DI water may be used as the solvent.

If a predetermined time (for example, 24 hours) has elapsed from when the substrate structure is immersed, the sacrificial layer 320 disposed between the support substrate 310 and the flattening layer 330 is gradually dissolved by the DI water, and disappears. Thus, the support substrate 310 is naturally separated from the substrate structure. Then, the substrate structure is drawn out from the DI water, and then is dried under atmospheric pressure and/or room temperature for a predetermined time. In this manner, a fabric substrate is manufactured.

As described above, the fabric substrate 100 according to the exemplary embodiment of the present invention has advantages that the surface roughness is very low, the interface property is excellent, and thus it is possible to form and operate various kinds of thin-film light emitting elements. In addition, since heat is not directly applied to the fabric in the fabric substrate 100 in a manufacturing process, strain by heat does not occur, and thus the exemplary embodiment can be applied to all fabrics.

Meanwhile, the stress buffer layer and the flattening layer constituting the fabric substrate 100 can minimize the occurrence of physical strain and mechanical stress and realize excellent bending property and wrinkling property. However, the stress buffer layer and the flattening layer have a problem in that the feeling of fit like actual clothes is not provided. Thus, measures of causing the stress buffer layer and the flattening layer to have a fabric-like pattern such that the stress buffer layer and the flattening layer may have elasticity, flexibility, and breathability similar to actual fabrics will be described below.

Figure 4A:
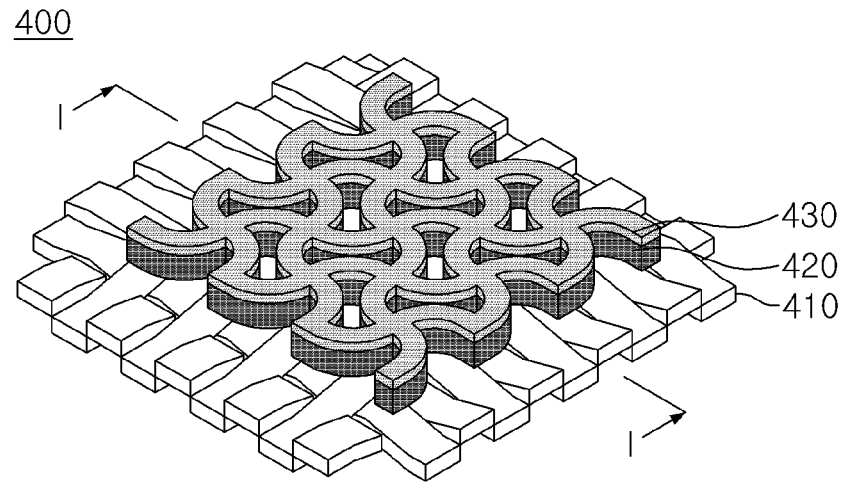
FIG. 4A is a perspective view illustrating a fabric substrate according to another exemplary embodiment of the present invention.
Figure 4B:
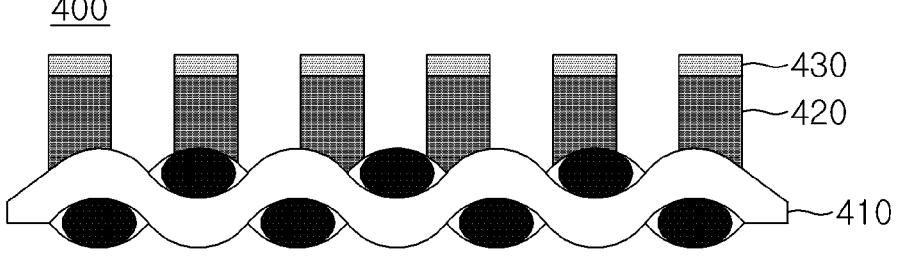
FIG. 4B is a cross-sectional view of the fabric substrate taken along line I-I in FIG. 4A.

FIG. 4A is a perspective view illustrating a fabric substrate according to another exemplary embodiment of the present invention. FIG. 4B is a cross-sectional view of the fabric substrate taken along line I-I in FIG. 4A.

With reference to FIGS. 4A and 4B, according to another exemplary embodiment of the present invention, a fabric substrate 400 may include a fabric layer 410, a stress buffer layer 420 on the fabric layer 410, and a flattening layer 430 on the stress buffer layer 420.

The fabric layer 410, the stress buffer layer 420, and the flattening layer 430 illustrated in FIG. 4A are identical or similar to the fabric layer 110, the stress buffer layer 120, and the flattening layer 130 illustrated in FIG. 1A. Thus, detailed descriptions of the fabric layer 410, the stress buffer layer 420, and the flattening layer 430 will not be repeated, and descriptions will be made focusing on a difference.

The fabric layer 410 is under the stress buffer layer 420 and the flattening layer 430 and may have a function to firmly support the stress buffer layer 420 and the flattening layer 430.

The fabric layer 410 is configured with at least one fabric. The fabric layer 410 may include, for example, all kinds of fabrics such as synthetic fibers, recycled fibers, natural fibers, cotton, polyester, leather, and linens.

The stress buffer layer 420 may be disposed on the fabric layer 410. At this time, the stress buffer layer 420 may be formed by at least one method of spin coating, bar coating, dip coating, and lamination.

Figure 5A:
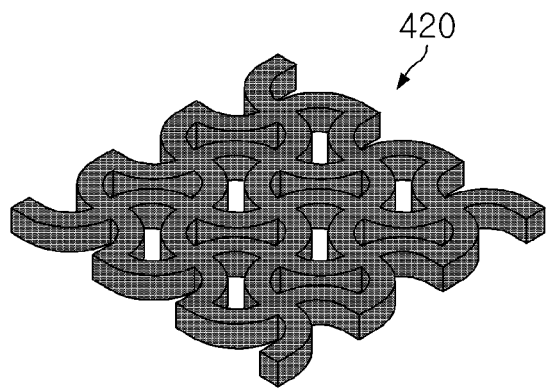
FIGS. 5A and 5B are diagrams illustrating a shape of a stress buffer layer and a flattening layer constituting the fabric substrate in FIG. 4A.
Figure 5B:
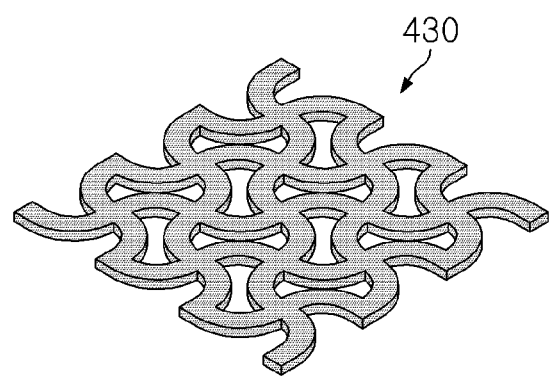

The stress buffer layer 420 may have multiple openings formed in accordance with a predetermined pattern. As an example, as illustrated in (a) of FIG. 5, the stress buffer layer 420 may include multiple openings corresponding to a fabric-like pattern. Although not illustrated, as another example, the stress buffer layer 420 may include multiple openings having a circular or polygonal shape.

The stress buffer layer 420 may function to minimize an occurrence of physical strain and internal stress caused by repeatedly bending the fabric layer 410. In addition, the stress buffer layer 420 may function to cause the fabric layer 410 and the flattening layer 430 to firmly adhere to each other. For this, the stress buffer layer 420 may be formed of a material having elasticity and adhesiveness.

The stress buffer layer 420 may be formed of a material having a Young's modulus of 500 MPa or less in order to minimize the occurrence of stress in the fabric substrate 400 and to secure flexibility of the fabric substrate 400. In addition, the stress buffer layer 420 may be formed of a material which is highly flexible and elastic, such that the strain occurring in the fabric layer 410 is not transferred to the flattening layer 430. The stress buffer layer 420 may be formed of an ultra-violet (UV) curable material. An epoxy-based material or an acrylic material may be representatively used for such a stress buffer layer 420, and the exemplary embodiment is not necessarily limited thereto.

The stress buffer layer 420 may be formed to have a thickness of 0.1 $\mu$m to 100 $\mu$m, preferably, a thickness of 1 $\mu$m to 10 $\mu$m such that it is possible to minimize the occurrence of strain in the fabric substrate 400, and to secure sufficient adhesion power.

The flattening layer 430 may be disposed on the stress buffer layer 420. At this time, the flattening layer 430 may be formed by at least one method of spin coating, bar coating, dip coating, and lamination.

The flattening layer 430 may be formed to have the same shape as that of the stress buffer layer 420. That is, the flattening layer 430 may include multiple openings formed in accordance with the predetermined pattern. As an example, as illustrated in (b) of FIG. 5, the flattening layer 430 may include multiple openings corresponding to a fabric-like pattern. At this time, the multiple openings may be formed at positions in the flattening layer 430, which correspond to positions of the multiple openings formed in the stress buffer layer 420.

The flattening layer 430 may function to improve smoothness of the fabric substrate 400. That is, the flattening layer 430 may provide a flat surface allowing a light emitting element to grow by a thin film vapor deposition process. In addition, the flattening layer 430 may provide a flat surface allowing the light emitting element to normally operate. For this, the flattening layer 430 may be formed of a material which has a surface roughness which is several nanometers (nm) or less and is similar to those of glass, and an interface property suitable for forming a thin film.

The flattening layer 430 may be formed of a material having a Young's modulus of 0.1 GPa or more in order to minimize the occurrence of strain in the light emitting element mounted on the flattening layer. The flattening layer 430 may be formed of a UV curable material. As an example, the flattening layer 430 may be formed of carbon-based polymers such as photocurable epoxy resin (SU-8), polyethylenenaphthalate (PEN), polyimide (PI), polyethylene terephthalate (PET), polyvinyl alcohol (PVA), acrylate, polyurethane, and polydimethylsiloxane. The material of the flattening layer is not necessarily limited thereto.

The flattening layer 430 may be formed to have a thickness of 50 $\mu$m or less, preferably, a thickness of 30 $\mu$m or less, such that a thin film as the flattening layer can be formed on the stress buffer layer 420.

As described above, an electroluminescence fabric may be configured in a manner that one or more light emitting elements (not illustrated) are mounted on the fabric substrate 400 formed by sequentially stacking the fabric layer 410, the stress buffer layer 420, and the flattening layer 430.

FIGS. 6A to 6G are diagrams illustrating a manufacturing method of a fabric substrate according to yet another exemplary embodiment of the present invention.

Figure 6A:
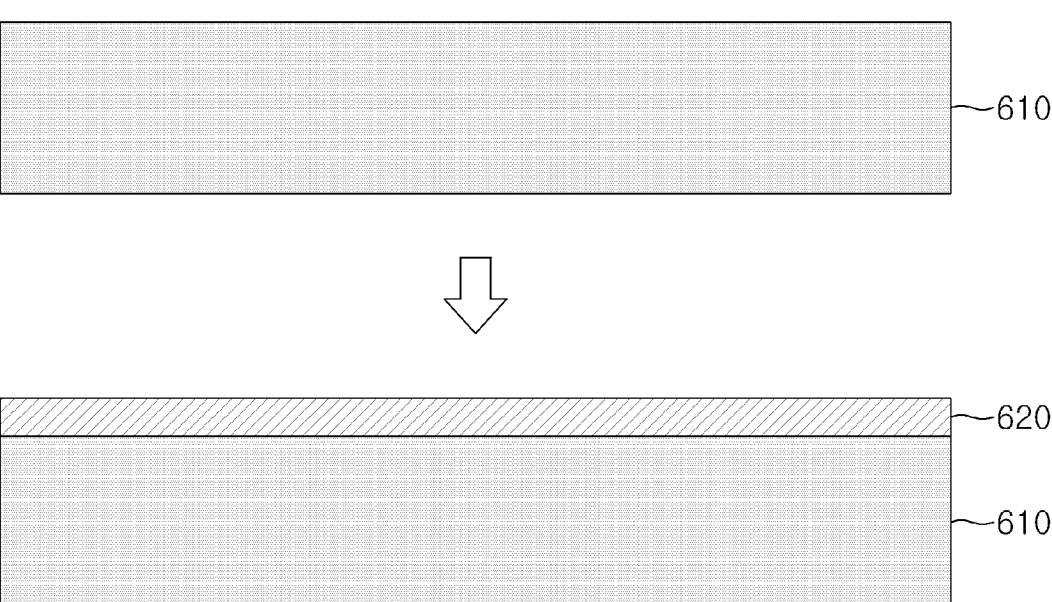

With reference to FIG. 6A, a support substrate 610 having predetermined size and thickness may be prepared. At this time, a flat substrate such as a glass substrate, a quartz substrate, a plastic substrate, a wafer, and the like can be used as the support substrate 610.

Then, a contaminant on the surface of the support substrate 610 may be removed with a washing solution. DI water may be used as the washing solution, and the exemplary embodiment is not necessarily limited thereto.

A thin metal film 620 may be formed on the support substrate 610 of which washing is finished, to have a predetermined thickness. As a material of the thin metal film 620, metal allowed to be patterned, for example, chromium (Cr), manganese (Mn), aluminum (Al), iron (Fe), titanium (Ti), nickel (Ni), molybdenum (Mo), silver (Ag), gold (Au), silicon (Si), Zinc (Zn) and alloys thereof may be used.

Figure 6B:
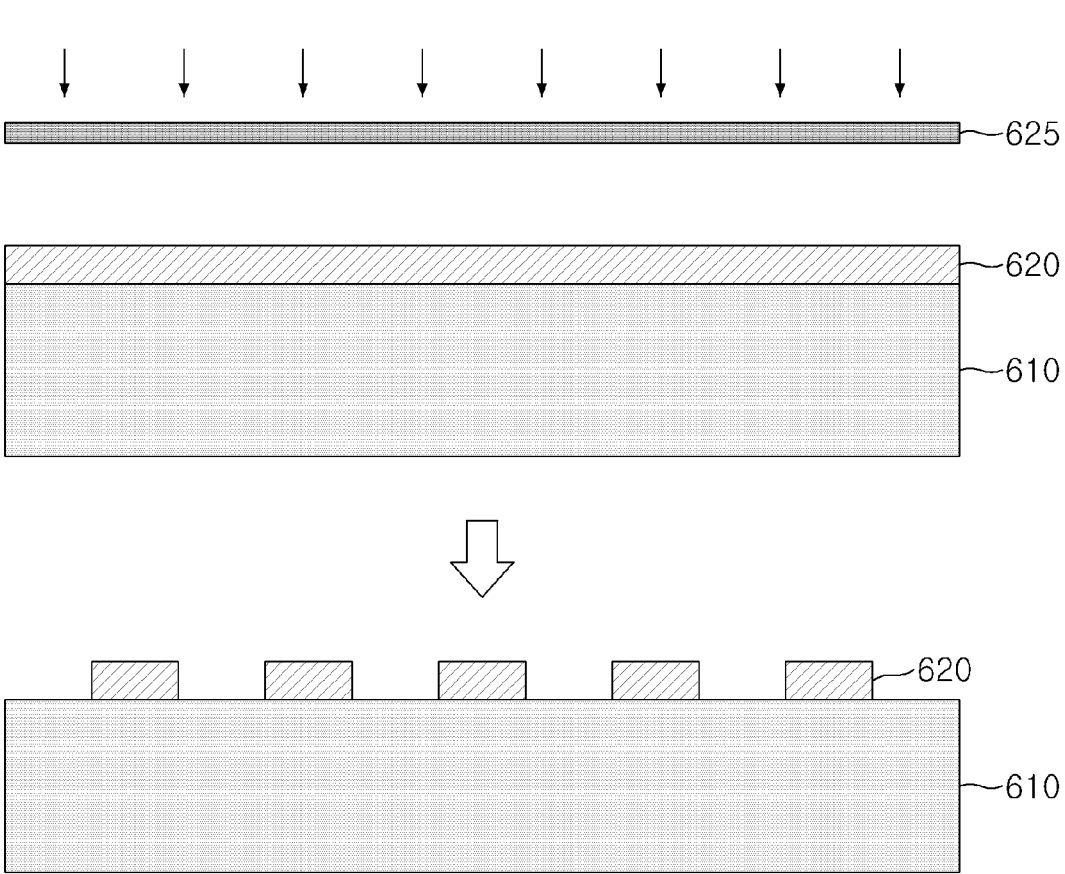

With reference to FIG. 6B, a photolithography process may be performed on the thin metal film 620 deposited on the support substrate 610, to form a metal pattern layer having a reversed pattern (referred to as "reversed fabric-like pattern" below for easy description) of the fabric-like pattern. That is, an exposure process may be performed on the thin metal film 620 with a mask 625 having a fabric-like pattern, and then a developing process of removing the thin metal film 620 corresponding to a photoresist (PR) may be performed with a developer.

Figure 6C:
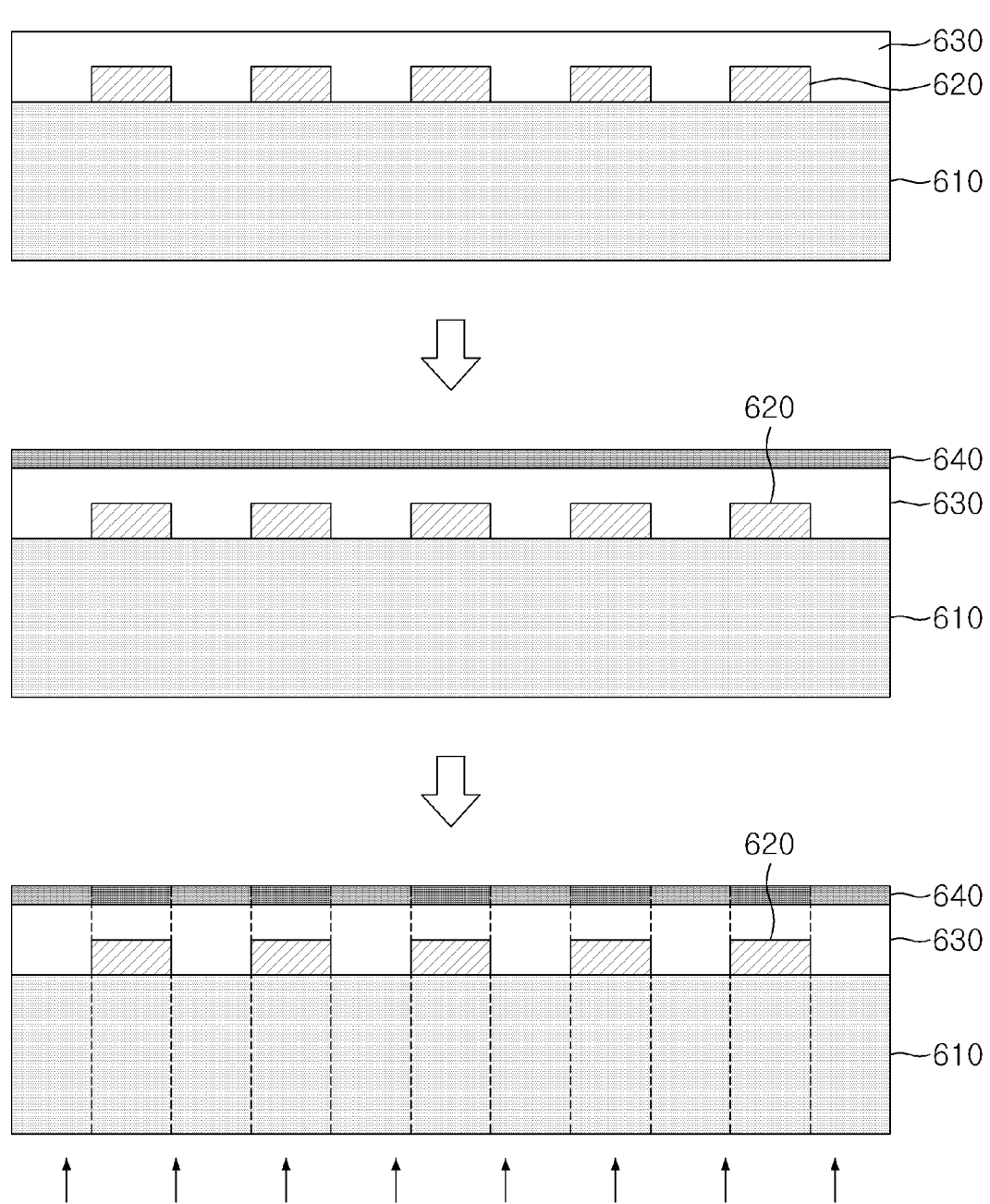

With reference to FIG. 6C, a sacrificial layer 630 may be stacked on the support substrate 610 and the metal pattern layer 620 with a spin coating process under conditions of predetermined pressure and/or temperature. Then, the sacrificial layer 630 may be firmly cured by applying heat at a predetermined temperature for a predetermined time. At this time, the sacrificial layer 630 may be formed on the support substrate 610 and the metal pattern layer 620 to have a thickness of 0.01 μm or more.

The sacrificial layer 630 stacked on the support substrate 610 and the metal pattern layer 620 may be formed of a material which is freely soluble in a solvent. As an example, the sacrificial layer 630 may be formed with polyvinyl alcohol (PVA), copper (Cu), or polymethyl methacrylate (PMMA).

When generation of such a sacrificial layer 630 is completed, a flattening layer 640 may be stacked on the sacrificial layer 630 with a spin coating process under conditions of predetermined pressure and/or temperature. Then, a soft-baking process of applying heat at a predetermined temperature (for example, 100 degrees) or lower to the flattening layer 640 for a predetermined time may be performed.

Then, a first UV curing process of performing irradiation with a UV ray for a predetermined time in a direction of the lower surface of the support substrate 610 may be performed, and thus the flattening layer 640 corresponding to regions (that is, regions through which the UV rays are transmitted) other than a region hidden by the metal pattern layer 620 may be cured. When the first UV curing process is completed, a hard-baking process of applying heat at a predetermined temperature (for example, 100 degrees) or higher to the flattening layer 640 for a predetermined time may be performed.

The flattening layer 640 may be formed of a material having a Young's modulus of 0.1 GPa or more. The flattening layer 640 may be formed of a UV curable material. As an example, the flattening layer 640 may be formed of a photocurable epoxy resin (SU-8) material.

Figure 6D:
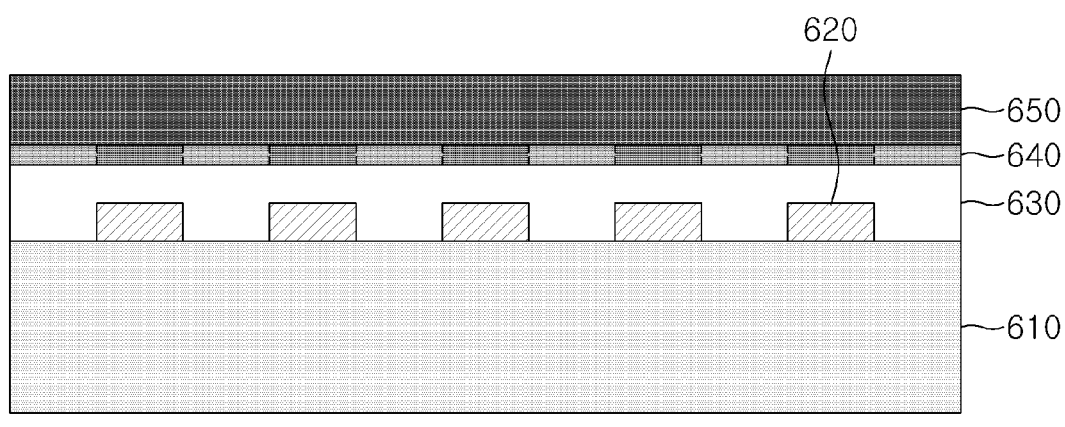
Figure 6D:
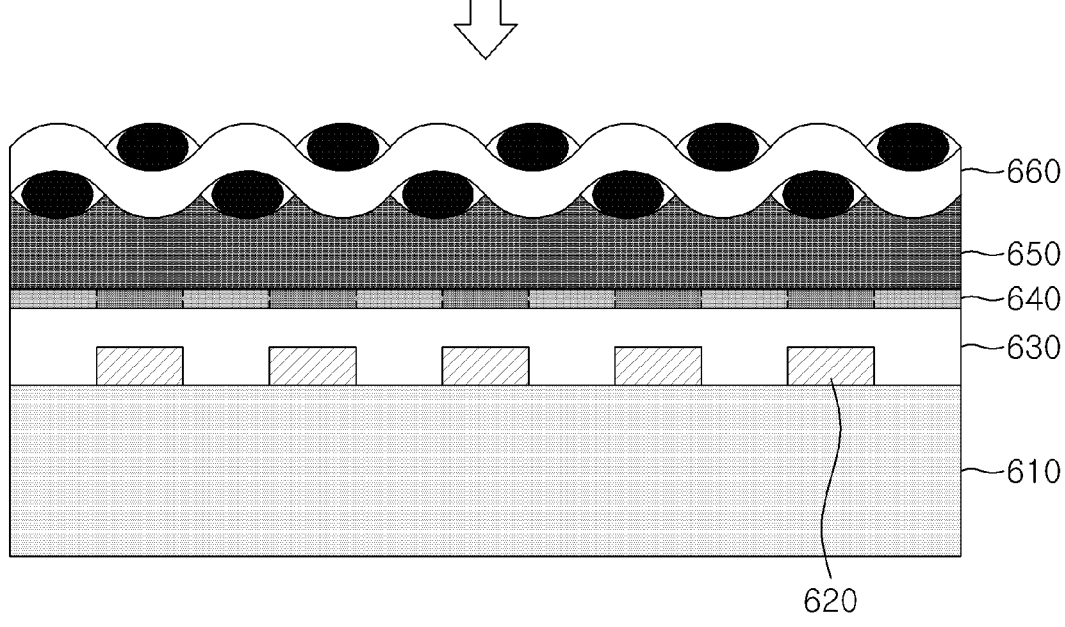
Figure 6E:
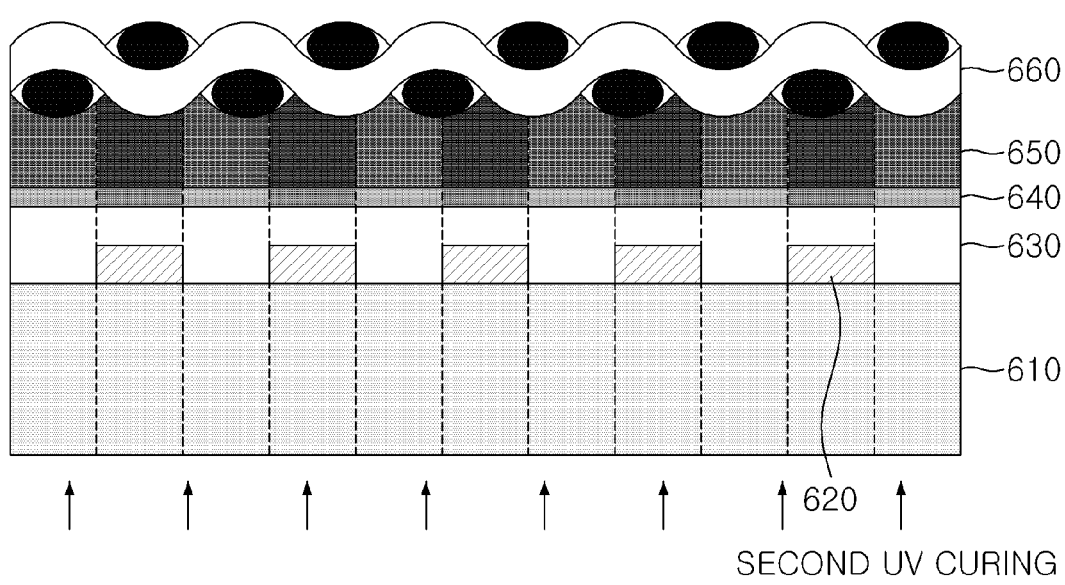

With reference to FIGS. 6D and 6E, a stress buffer layer 650 may be stacked on the flattening layer 640 with a spin coating process under conditions of predetermined pressure and/or temperature. When stacking of the stress buffer layer 650 is completed, a fabric layer (or fabric, 660) may be stacked on the stress buffer layer 650 by a lamination process. That is, the fabric layer 660 is disposed on the stress buffer layer 650, and then predetermined pressure is applied in a direction of the fabric layer 660 for a predetermined time. This is because the stress buffer layer 650 in a liquid state is absorbed to the fabric layer 660 so as to improve an adhesive force.

Then, a soft-baking process of applying heat at a predetermined temperature (for example, 100 degrees) or lower to the stress buffer layer 650 for a predetermined time may be performed. With such a soft-baking process, the stress buffer layer 650 may cause the flattening layer 640 and the fabric layer 660 to be firmly bound to each other (firmly adhere to each other).

Then, a second UV curing process of performing irradiation with a UV ray for a predetermined time in the direction of the lower surface of the support substrate 610 may be performed, and thus the stress buffer layer 650 corresponding to regions (that is, regions through which the UV rays are transmitted) other than a region hidden by the metal pattern layer 620 may be cured. If the second UV curing process is completed, a hard-baking process of applying heat at a predetermined temperature (for example, 100 degrees) or higher to the stress buffer layer 650 for a predetermined time may be performed.

The stress buffer layer 650 may be formed of a material having a Young's modulus of 500 MPa or less. In addition, the stress buffer layer 650 may be formed of a UV curable material. As an example, the stress buffer layer 650 may be formed of an epoxy-based or acrylic material.

Meanwhile, in the exemplary embodiment, a case where two UV curing processes are performed is described as an example. However, the exemplary embodiment is not necessarily limited thereto, and it is apparent to those skilled in the art that one UV curing process may be performed. For example, the flattening layer 640 may be stacked on the sacrificial layer 630, and then a first soft-baking process may be performed. Then, the stress buffer layer 650 and the fabric layer 660 may be sequentially stacked on the flattening layer 640, and then a second soft-baking process may be performed. In addition, the UV curing process of performing irradiation with a UV ray for a predetermined time in the direction of the lower surface of the support substrate 610 for a predetermined time may be performed, and then the hard-baking process of applying heat of a predetermined temperature (for example, 100 degrees) or higher to the flattening layer 640 and the stress buffer layer 650 for a predetermined time may be performed.

Figure 6F:
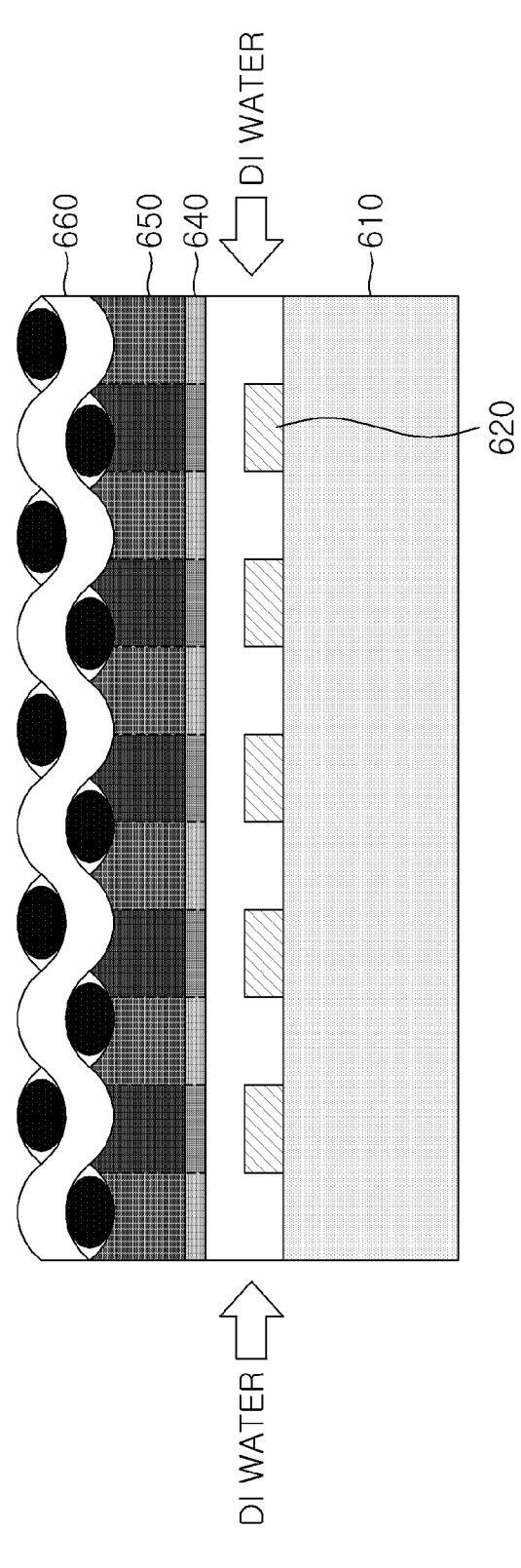

With reference to FIG. 6F, a first substrate structure in which the support substrate 610, the metal pattern layer 620, the sacrificial layer 630, the flattening layer 640, the stress buffer layer 650, and the fabric layer 660 are sequentially stacked may be immersed in a predetermined solvent for a predetermined time. At this time, DI water may be used as the solvent.

If a predetermined time (for example, 24 hours) has elapsed from when the first substrate structure is immersed, the sacrificial layer 630 disposed between the support substrate 610, and the metal pattern layer 620 and the flattening layer 640 is gradually dissolved by the DI water, and disappears. Thus, the support substrate 610 and the metal pattern layer 620 are naturally separated from the first substrate structure. Then, a second substrate structure constituted by the flattening layer 640, the stress buffer layer 650, and the fabric layer 660 may be drawn out from DI water, and then the second substrate structure may be dried.

Figure 6G:
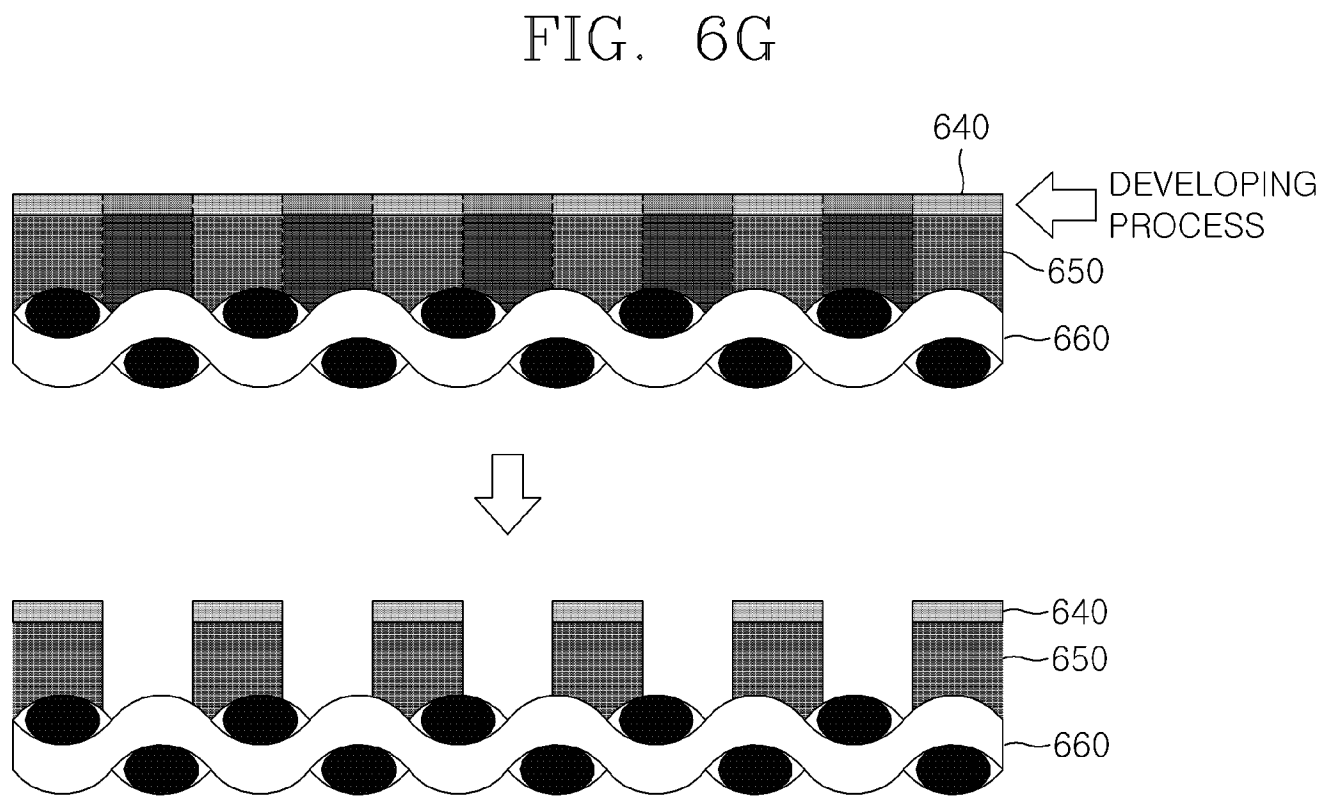

With reference to FIG. 6G, the second substrate structure in which the flattening layer 640, the stress buffer layer 650, and the fabric layer 660 are sequentially stacked may be immersed in a predetermined developer for a predetermined time. At this time, a composition in which an ionic or nonionic surfactant is added to an inorganic and organic alkaline aqueous solution may be used as the developer, but the exemplary embodiment is not necessarily limited thereto.

If a predetermined time has elapsed from when the second substrate structure is immersed, the developer chemically reacts with portions of the flattening layer 640 and the stress buffer layer 650, in which UV curing does not occur, and thus the above portions are selectively etched. Thus, multiple openings in accordance with the fabric-like pattern are formed in the flattening layer 640 and the stress buffer layer 650. Then, the second substrate structure is drawn out from the developer, and then is dried under predetermined conditions for a predetermined time. In this manner, a fabric substrate is manufactured.

Figure 7A:
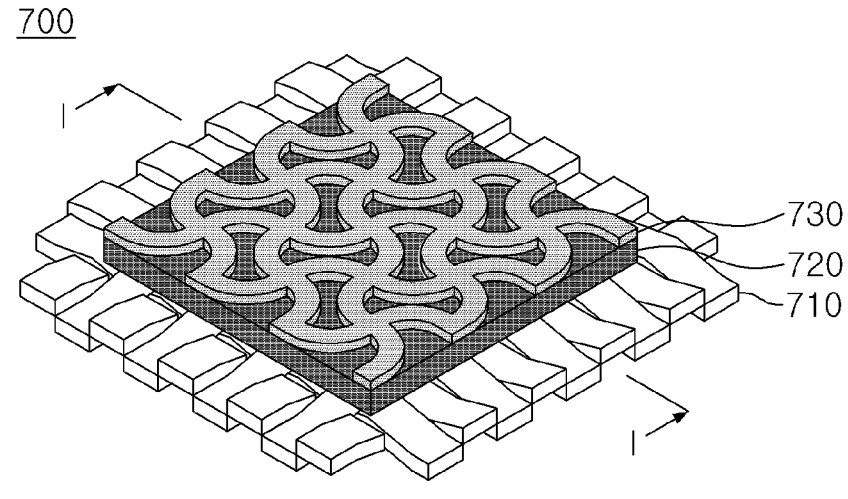
FIG. 7A is a perspective view illustrating a fabric substrate according to yet another exemplary embodiment of the present invention.
Figure 7B:
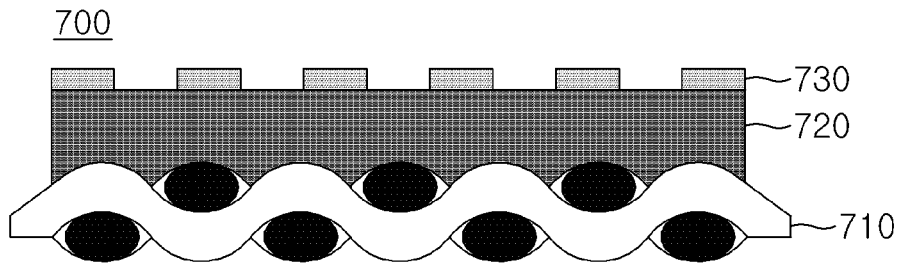
FIG. 7B is a cross-sectional view of the fabric substrate taken along line I-I in FIG. 7A.

As described above, according to another exemplary embodiment of the present invention, since the fabric substrate 400 has flexibility similar to that of a fabric, it is possible to wrinkle the substrate in various directions like actual clothing, and to operate the light emitting element even after a predetermined number of times of repetitive bending. In addition, the fabric substrate 400 has an advantage that functionality and breathability similar to those of actual fabrics are imparted, and thus it is possible to provide a comfortable and cool fit similar to actual clothes. FIG. 7A is a perspective view illustrating a fabric substrate according to yet another exemplary embodiment of the present invention. FIG. 7B is a cross-sectional view of the fabric substrate taken along line I-I in FIG. 7A.

With reference to FIGS. 7A and 7B, according to still another exemplary embodiment of the present invention, a fabric substrate 700 may include a fabric layer 710, a stress buffer layer 720 on the fabric layer 710, and a flattening layer 730 on the stress buffer layer 720.

The fabric layer 710, the stress buffer layer 720, and the flattening layer 730 illustrated in FIG. 7A are identical or similar to the fabric layer 110 or 410, the stress buffer layer 120 or 420, and the flattening layer 130 or 430 illustrated in FIG. 1A or 4A. Thus, detailed descriptions of the fabric layer 710, the stress buffer layer 720, and the flattening layer 730 will not be repeated, and descriptions will be made focusing on a difference.

The fabric layer 710 is under the stress buffer layer 720 and the flattening layer 730 and may have a function to firmly support the stress buffer layer 720 and the flattening layer 730.

The stress buffer layer 720 may be disposed on the fabric layer 710. At this time, the stress buffer layer 720 may be formed by at least one method of spin coating, bar coating, dip coating, and lamination.

Figure 8A:
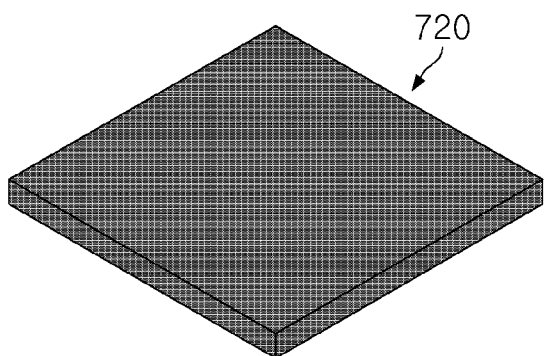
FIGS. 8A and 8B are diagrams illustrating a shape of a stress buffer layer and a flattening layer constituting the fabric substrate in FIG. 7A.
Figure 8B:
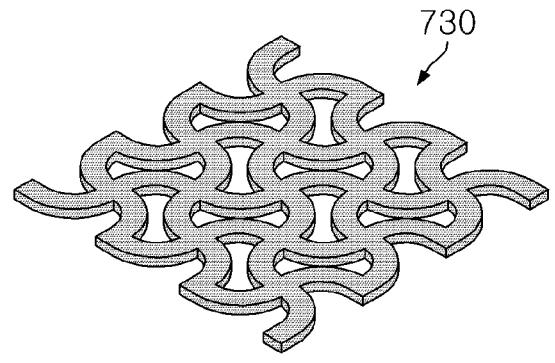

The stress buffer layer 720 does not include multiple openings formed in accordance with a predetermined pattern, differing from the stress buffer layer 420 illustrated in FIG. 4A. As an example, as illustrated in (a) of FIG. 8, the stress buffer layer 720 may be formed to have a thin film shape.

The stress buffer layer 720 may function to minimize an occurrence of physical strain and stress caused by repeatedly bending the fabric layer 710. In addition, the stress buffer layer 720 may function to cause the fabric layer 710 and the flattening layer 730 to firmly adhere to each other. For this, the stress buffer layer 720 may be formed of a material having elasticity and adhesiveness.

The stress buffer layer 720 may be formed of a material which may be hardened under atmospheric pressure or room temperature, in order not to directly apply heat to a fabric in a manufacturing process of a fabric substrate. Representatively, a silicon (Si) based material may be used for such a stress buffer layer 720. As an example, a polydimethylsiloxane (PDMS) based silicon material may be used for the stress buffer layer 720, and the exemplary embodiment is not necessarily limited thereto.

The flattening layer 730 may be disposed on the stress buffer layer 720. At this time, the flattening layer 730 may be formed by at least one method of spin coating, bar coating, dip coating, and lamination.

The flattening layer 730 may include multiple openings formed in accordance with the predetermined pattern. As an example, as illustrated in (b) of FIG. 8, the flattening layer 730 may include multiple openings corresponding to a fabric-like pattern. Although not illustrated, as another example, the flattening layer 730 may include multiple openings having a circular or polygonal shape.

The flattening layer 730 may function to improve smoothness of the fabric substrate 700. For this, the flattening layer 730 may be formed of a material which has a surface roughness which is several nanometers (nm) or less and is similar to those of glass, and an interface property suitable for forming a thin film.

The flattening layer 730 may be formed of a material having a Young's modulus of 0.1 GPa or more in order to minimize the occurrence of strain in the light emitting element mounted on the flattening layer. The flattening layer 730 may be formed of a UV curable material. As an example, the flattening layer 430 may be formed of carbon-based polymers such as photocurable epoxy resin (SU-8), polyethylenenaphthalate (PEN), polyimide (PI), polyethylene terephthalate (PET), polyvinyl alcohol (PVA), acrylate, polyurethane, and polydimethylsiloxane. The material of the flattening layer is not necessarily limited thereto.

As described above, an electroluminescence fabric may be configured in a manner that one or more light emitting elements (not illustrated) are mounted on the fabric substrate 700 formed by sequentially stacking the fabric layer 710, the stress buffer layer 720, and the flattening layer 730.

FIGS. 9A to 9G are diagrams illustrating a manufacturing method of a fabric substrate according to yet another exemplary embodiment of the present invention.

The manufacturing method of a fabric substrate illustrated in FIGS. 9A to 9G is similar to the manufacturing method of a fabric substrate illustrated in FIGS. 6A to 6G, and thus descriptions will be made focusing on differences.

Figure 9A:
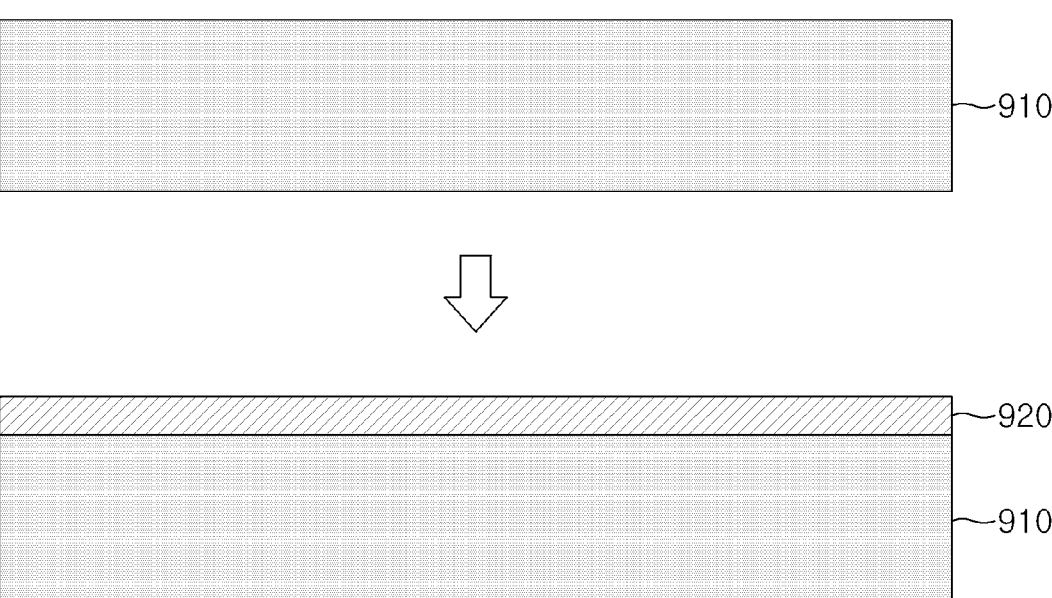

With reference to FIG. 9A, a support substrate 910 having predetermined size and thickness may be prepared. Then, a contaminant on the surface of the support substrate 910 may be removed with a washing solution.

A thin metal film 920 may be formed on the support substrate 910 of which washing is finished, to have a predetermined thickness. As a material of the thin metal film 920, metal allowed to be patterned, for example, chromium (Cr), aluminum (Al), iron (Fe), titanium (Ti), nickel (Ni), molybdenum (Mo), manganese (Mn), silver (Ag), gold (Au), silicon (Si), Zinc (Zn) and alloys thereof may be used.

Figure 9B:
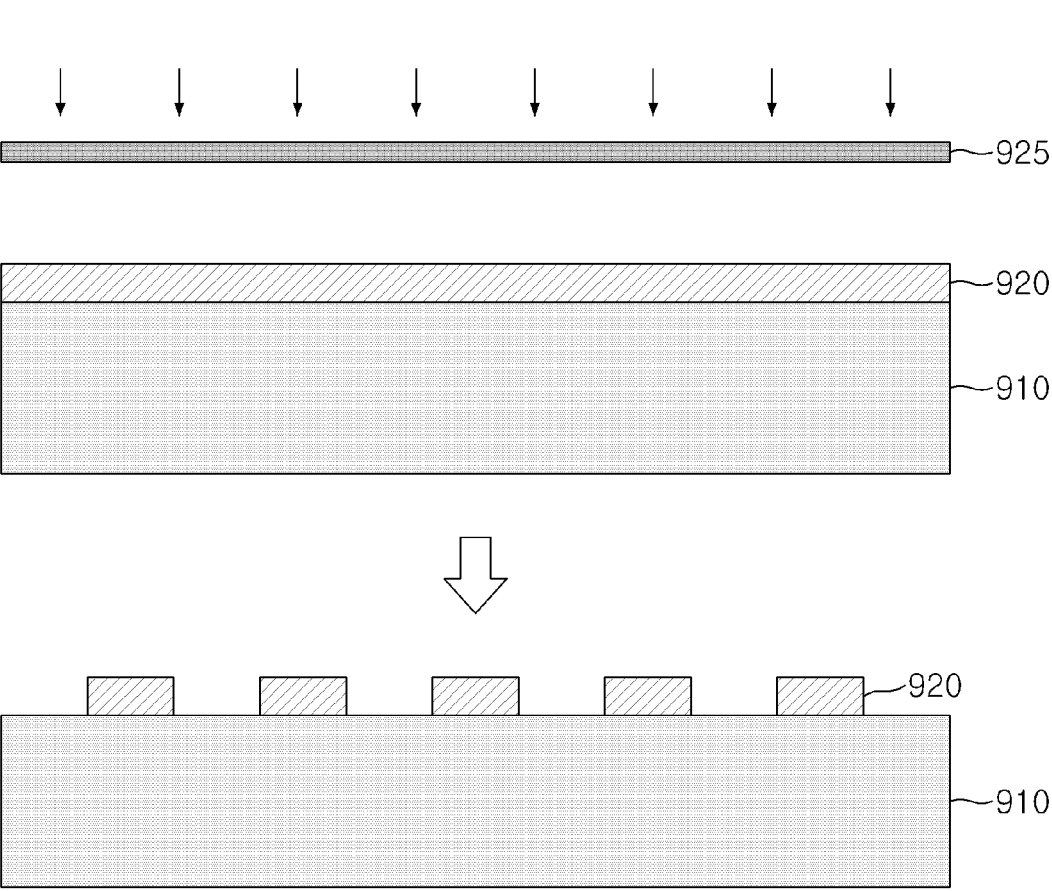

With reference to FIG. 9B, a photolithography process may be performed on the thin metal film 620 deposited on the support substrate 610, to form a metal pattern layer having a reversed pattern of the fabric-like pattern, that is, a reversed fabric-like pattern. That is, an exposure process may be performed on the thin metal film 920 with a mask 925 having a fabric-like pattern, and then a developing process of removing the thin metal film 920 corresponding to a photoresist (PR) may be performed with a developer.

15 16

Figure 9C:
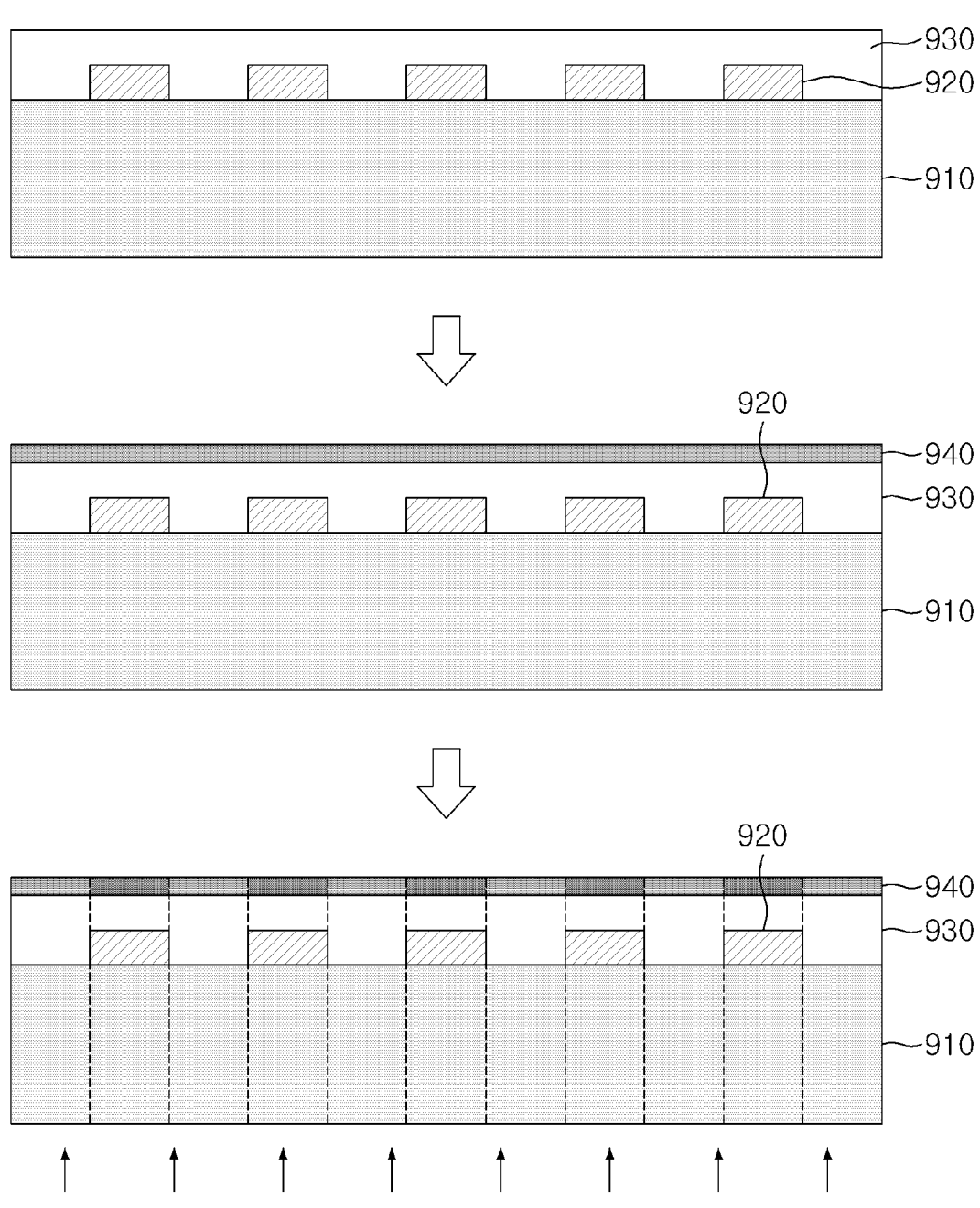

With reference to FIG. 9C, a sacrificial layer 930 may be stacked on the support substrate 910 and the metal pattern layer 920 with a spin coating process under conditions of predetermined pressure and/or temperature. Then, the sacrificial layer 930 may be firmly cured by applying heat at a predetermined temperature for a predetermined time.

If generation of such a sacrificial layer 930 is completed, a flattening layer 940 may be stacked on the sacrificial layer 930 with a spin coating process under conditions of predetermined pressure and/or temperature. Then, a soft-baking process of applying heat of a predetermined temperature (for example, 100 degrees) or lower to the flattening layer 940 for a predetermined time may be performed.

Then, a UV curing process of performing irradiation with a UV ray for a predetermined time in a direction of the lower surface of the support substrate 910 may be performed, and thus the flattening layer 940 corresponding to regions (that is, regions through which the UV rays are transmitted) other than a region hidden by the metal pattern layer 920 may be cured. If the UV curing process is completed, a hard-baking process of applying heat of a predetermined temperature (for example, 100 degrees) or higher to the flattening layer 940 for a predetermined time may be performed.

Figure 9D:
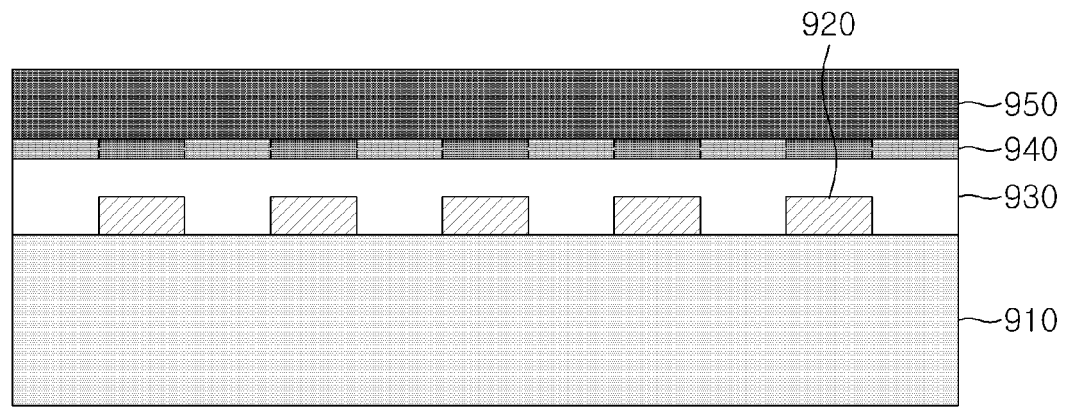
Figure 9E:
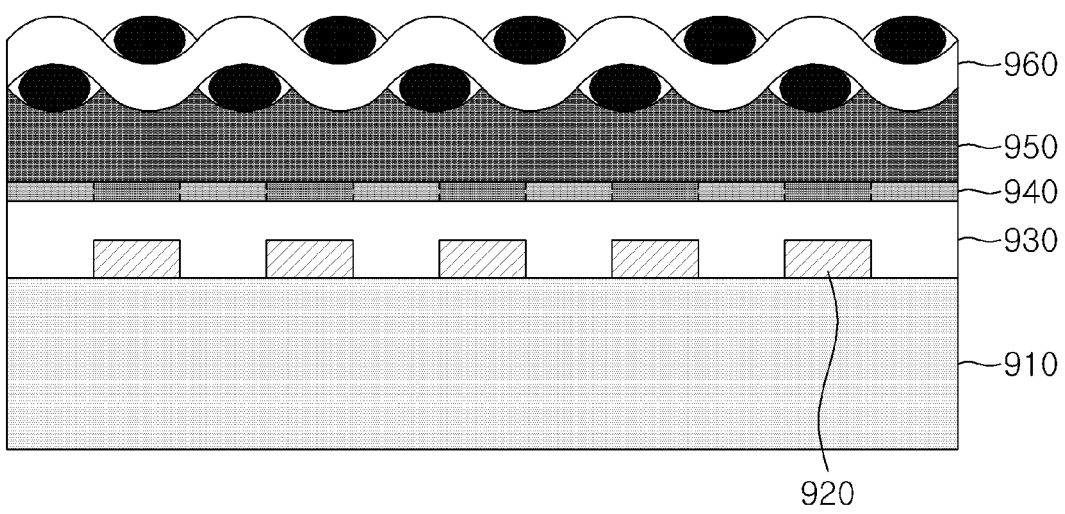

With reference to FIGS. 9D and 9E, a stress buffer layer 950 may be stacked on the flattening layer 940 with a spin coating process under conditions of predetermined pressure and/or temperature.

Then, a fabric layer (or fabric, 960) may be stacked on the stress buffer layer 950 with a lamination process. That is, the fabric layer 960 is disposed on the stress buffer layer 950, and then predetermined pressure is applied in a direction of the fabric layer 960 for a predetermined time. This is because the stress buffer layer 950 in a liquid state is caused to be absorbed to the fabric layer 960 so as to improve an adhesive force. In such a state, the stress buffer layer 950 is slowly hardened under atmospheric pressure or room temperature when a predetermined time elapsed. Thus, the stress buffer layer 950 may cause the flattening layer 940 and the fabric layer 960 to be firmly bound to each other (firmly adhere to each other).

In a case of the above stacking process, the stress buffer layer 950 located under the fabric layer 960 is hardened at room temperature. Thus, all kinds of fabrics such as synthetic fibers, recycled fibers, natural fibers, cotton, polyester, leather, and linens may be used for the fabric substrate.

Figure 9F:
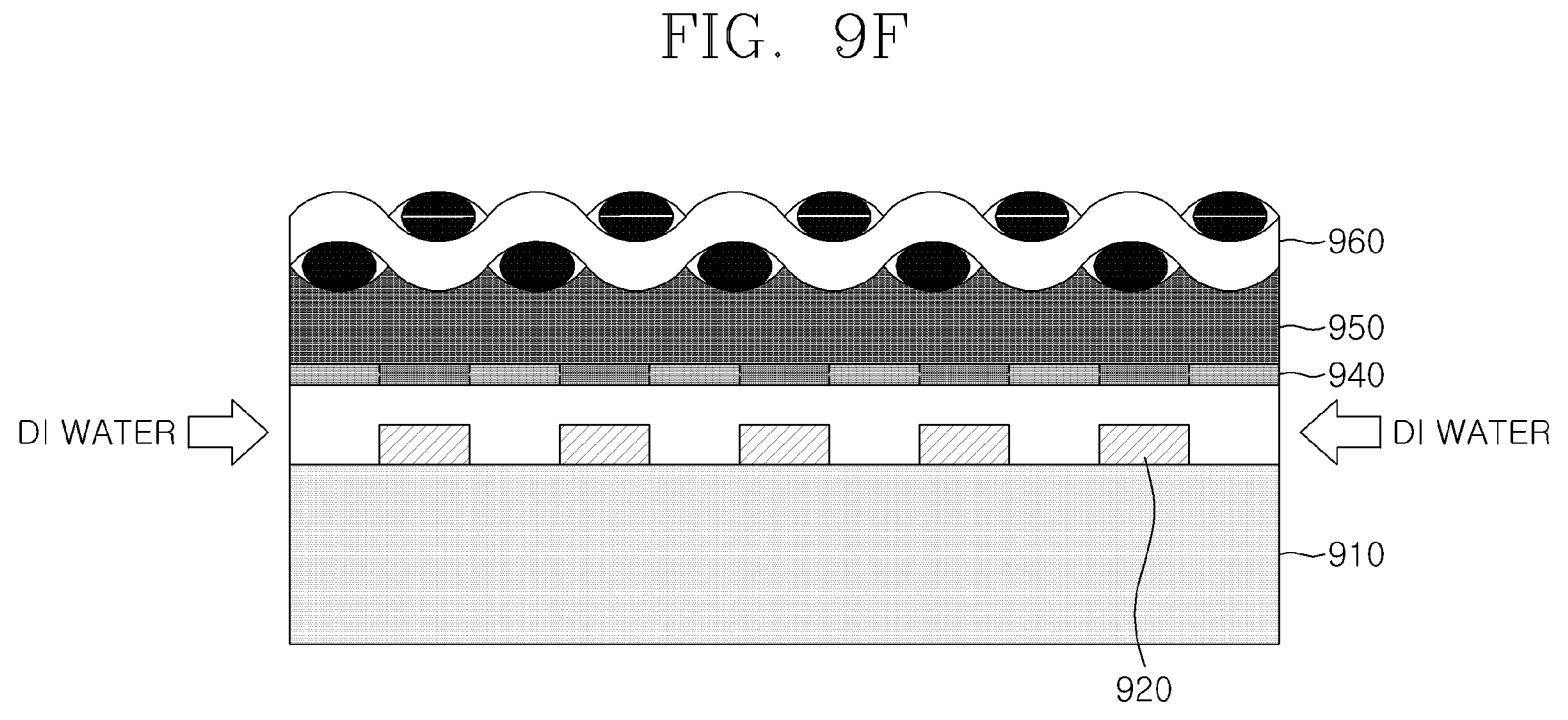

With reference to FIG. 9F, a first substrate structure in which the support substrate 910, the metal pattern layer 920, the sacrificial layer 930, the flattening layer 940, the stress buffer layer 950, and the fabric layer 960 are sequentially stacked may be immersed in a predetermined solvent (for example, DI water) for a predetermined time.

If a predetermined time (for example, 24 hours) has elapsed from when the first substrate structure is immersed, the sacrificial layer 930 disposed between the support substrate 910, and the metal pattern layer 920 and the flattening layer 940 is gradually dissolved by the DI water, and disappears. Thus, the support substrate 910 and the metal pattern layer 920 are naturally separated from the first substrate structure. Then, a second substrate structure constituted by the flattening layer 940, the stress buffer layer 950, and the fabric layer 960 may be drawn out from DI water, and then the second substrate structure may be dried.

Figure 9G:
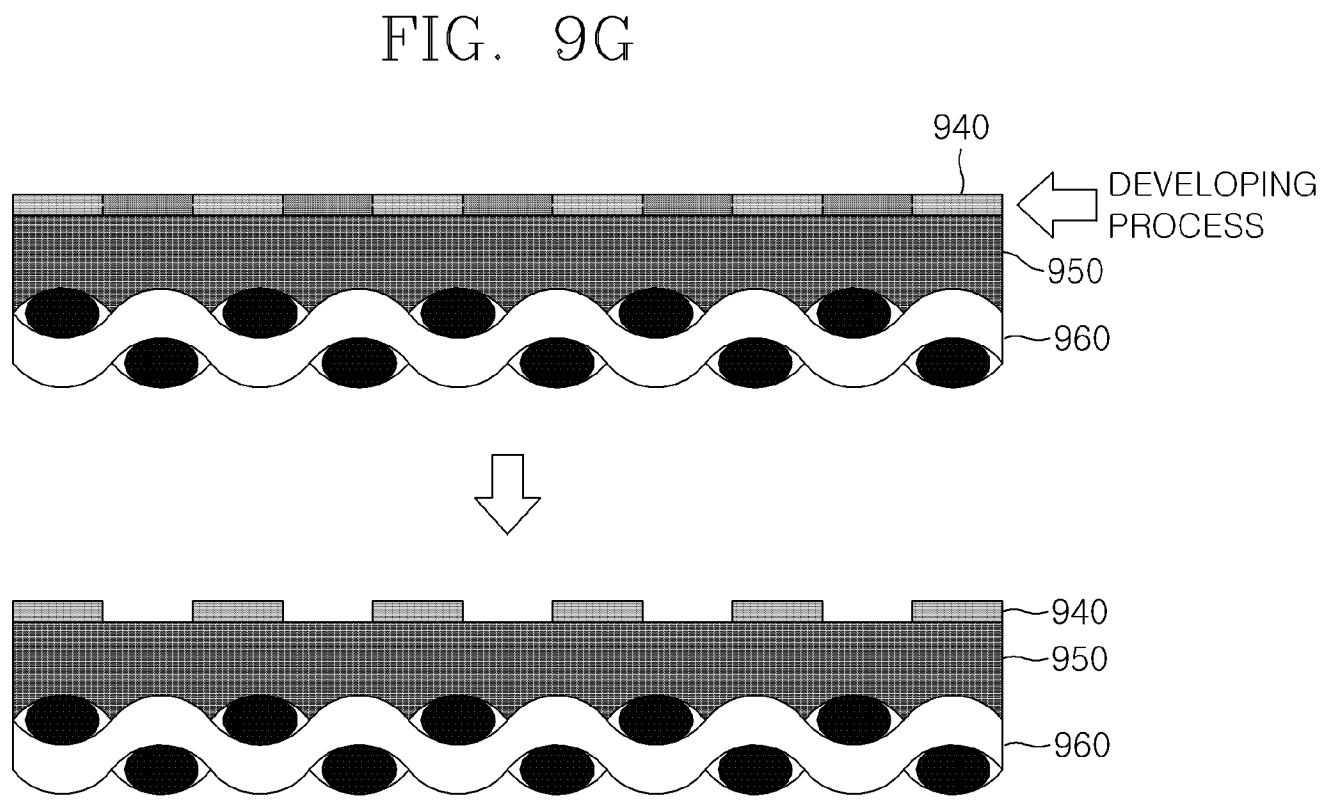

With reference to FIG. 9G, the second substrate structure in which the flattening layer 940, the stress buffer layer 950, and the fabric layer 960 are sequentially stacked may be immersed in a predetermined developer for a predetermined time.

If a predetermined time has elapsed from when the second substrate structure is immersed, the developer chemically reacts with portions of the flattening layer 940 and the stress buffer layer 950, in which UV curing does not occur, and thus the above portions are selectively etched. Thus, multiple openings in accordance with the fabric-like pattern are formed in the flattening layer 940 and the stress buffer layer 950. Then, the second substrate structure is drawn out from the developer, and then is dried under predetermined conditions for a predetermined time. In this manner, a fabric substrate is manufactured.

As described above, according to still yet another exemplary embodiment of the present invention, since the fabric substrate 700 has flexibility similar to that of a fabric, it is possible to wrinkle the substrate in various directions like actual clothing, and to operate the light emitting element even after a predetermined number of times of repetitive bending.

Figure 10:
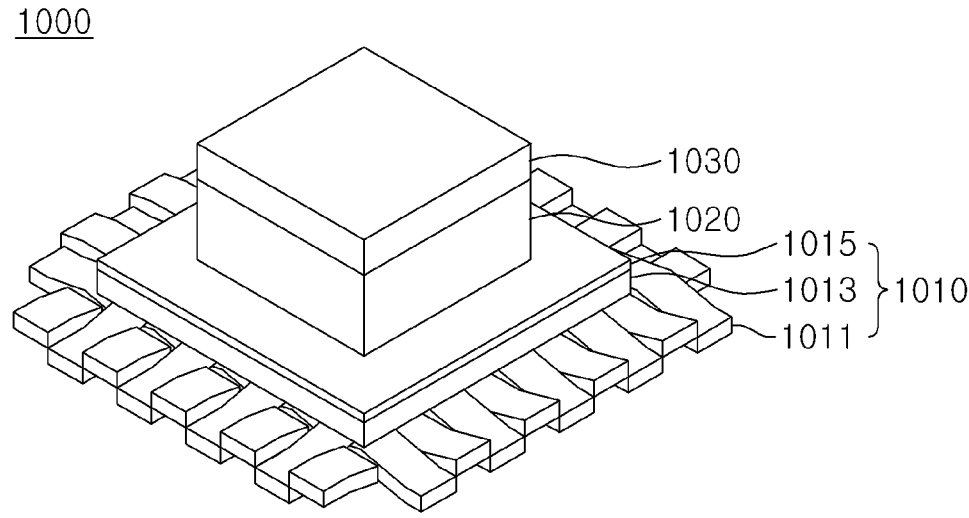
FIG. 10 is a perspective view illustrating an electroluminescence fabric according to an exemplary embodiment of the present invention.

FIG. 10 is a perspective view illustrating an electroluminescence fabric according to an exemplary embodiment of the present invention.

With reference to FIG. 10, according to an exemplary embodiment of the present invention, an electroluminescence fabric 1000 includes a fabric substrate 1010, a light emitting element 1020 on the fabric substrate 1010, and a sealing layer 1030 on the light emitting element 1020.

The fabric substrate 1010 may be disposed under the light emitting element 1020 to support the light emitting element 1020. In addition, as the fabric substrate 1010, a substrate having a very low surface roughness and an excellent interface property may be provided to form (that is, grow) and operate the light emitting element 1020.

The fabric substrate 1010 may include a fabric layer 1011, a stress buffer layer 1013 on the fabric layer 1011, and a flattening layer 1015 on the stress buffer layer 1013. Here, the fabric layer 1011 may be disposed under the stress buffer layer 1013 and may have a function to support the stress buffer layer 1013 and the flattening layer 1015. The stress buffer layer 1013 is disposed between the fabric layer 1011 and the flattening layer 1015. Thus, the stress buffer layer 1013 is caused to bind (adhere to) the fabric layer 1011 and the flattening layer 1015 to each other, and thus it is possible to minimize the occurrence of strain and stress caused by repetitively bending the fabric layer 1011. The flattening layer 1015 may be disposed on the stress buffer layer 1013 to improve smoothness of the fabric substrate 1010.

The light emitting element 1020 may be formed on the fabric substrate 1010 to emit light having a predetermined wavelength. Various kinds of thin-film light emitting elements such as a light emitting diode (LED) element, an organic light emitting diode (OLED) element, a polymer light emitting diode (PLED) element, and an inorganic EL element may be used as the light emitting element 1020, and the exemplary embodiment is not necessarily limited thereto. Among the above elements, the organic light emitting diode (OLED) element is the next-generation display device that performs electroluminescence with electrodes having a thickness of several tens to hundreds nanometers, and an organic substance. The OLED element attracts much attentions because the OLED element has a low operating voltage and high luminous efficiency, and is easy to realize transparent and flexible characteristics. Accordingly, in this exemplary embodiment, a case where an organic light emitting diode (OLED) element is used as the light emitting element 1020 of the electroluminescence fabric 1000 will be described below as an example.

The organic light emitting element 1020 may be, for example, a top-emitting organic light emitting element having a top-emitting structure, and may emit light in a direction of the sealing layer 1030 located at the upper portion of the electroluminescence fabric 1000. In this case, if an upper electrode of the organic light emitting element 1020 is formed to be thin (for example, 10 nm to 50 nm), it is possible to emit light in the direction of the sealing layer 1030 corresponding to the upper electrode.

Meanwhile, as another example, the organic light emitting element 1020 may be a bottom-emitting organic light emitting element having a bottom-emitting structure, and may emit light in a direction of the fabric substrate 1010 located at the lower portion of the electroluminescence fabric 1000. In this case, if a lower electrode of the organic light emitting element 1020 is formed to be thin (for example, 10 nm to 50 nm), it is possible to emit light in the direction of the fabric substrate 1010 corresponding to the lower electrode.

The organic light emitting element 1020 may include a non-inverting structure. In the non-inverting structure, a positive electrode layer as the lower electrode, a hole injection layer (HIL), a hole transfer layer (HTL), an emission material layer (EML), an electron transfer layer (ETL), an electron injection layer (EIL), a negative electrode layer as the upper electrode, and a capping layer are formed on the fabric substrate 1010 in this order.

As yet another example, the organic light emitting element 1020 may include an inverting structure in which the negative electrode layer as the lower electrode, the electron injection layer (EIL), the electron transfer layer (ETL), the emission material layer (EML), the hole transfer layer (HTL), the hole injection layer (HIL), the positive electrode layer as the upper electrode, and the capping layer are formed on the fabric substrate 1010 in this order. Here, the hole injection layer, the hole transfer layer, the emission material layer, the electron transfer layer, and the electron injection layer may constitute an organic layer of the organic light emitting element 1020. The capping layer is an organic layer that causes refractive indices (n) of an organic layer and an inorganic layer which are respectively formed on and under the upper electrode to match with each other so as to improve light extraction and protects the organic light emitting element 1020. The capping layer may be deposited on the negative electrode layer or the positive electrode layer.

The positive electrode layer (Anode) or the negative electrode layer (Cathode) may be formed by a thermal evaporation method with silver (Ag), gold (Au), or aluminum (Al) being a conductive metal material. The thickness of the positive electrode layer or the negative electrode layer may be 10 nm to 200 nm. The positive electrode layer or the negative electrode layer may include a silver nanowire, a single walled carbon nanotube (SWCNT), a multi-wall carbon nanotube (MWCNT), and conductive polymers such as graphene or polyaniline.

In order to realize such an organic light emitting element 1020 on the fabric substrate 1010, the surface roughness is required to be, for example, several to tens of nanometers. In addition, since the organic light emitting element 1020 is different from an inorganic light emitting element in that the element is easily contaminated by moisture ($H_2O$) or oxygen ($O_2$), sealing for preventing vapor permeance is required.

The sealing layer 1030 may be disposed on the organic light emitting element 1020 to seal the organic light emitting element 1020. The sealing layer 1030 may be an aluminum oxide ($Al_2O_3$) layer, a magnesium oxide (MgO) layer, a multilayer thin film structure in which an aluminum oxide layer and an organic layer are alternately stacked, or a multilayer thin film structure in which an aluminum oxide layer and a magnesium oxide layer are alternately stacked. In the multilayer thin film structure in which the aluminum oxide layer and the organic layer are alternately stacked, the aluminum oxide layer and the organic layer may be stacked on the organic light emitting element 1020 in this order.

The sealing layer 1030 may be a multilayer thin film structure in which a multilayer thin film sealing layer and an organic layer are alternately stacked. Here, the multilayer thin film sealing layer may be formed in a manner that at least two or more of an aluminum oxide ($Al_2O_3$) layer, a magnesium oxide (MgO) layer, a zinc oxide (ZnO) layer, a silicon dioxide ($SiO_2$) layer, and a titanium dioxide ($TiO_2$) layer are alternately stacked.

The organic layer may contain, for example, polyvinyl alcohol, acrylate, or UV curable polymers including Bisphenol-F. The organic layer may be formed by various methods such as thermal evaporation, spin coating, bar coating, and dip coating.

The aluminum oxide layer and the magnesium oxide layer may be formed by an atomic layer deposition method with an atomic layer deposition (ALD) device or by a chemical vapor deposition method with a chemical vapor deposition (CVD) device. The zinc oxide (ZnO) layer and the titanium dioxide ($TiO_2$) layer may be formed by an atomic layer deposition method with an ALD device. The silicon dioxide ($SiO_2$) layer may be formed by an E-beam deposition device.

As described above, according to the present invention, the electroluminescence fabric includes a fabric substrate having flexibility like fabric and an excellent interface property, and thus has an excellent feeling of fit and does not cause heterogeneity to a user. In addition, the electroluminescence fabric is endlessly available in connection with various smart devices.

Hitherto, the specific exemplary embodiments of the present invention are described, but various modifications can be made in a range without departing from the gist of the present invention. The scope of the present invention is not limited to the above-described exemplary embodiment, and should be defined by the claims as follows and the equivalents of the claims.

What is claimed is:
1. A manufacturing method of a fabric substrate, comprising:
   forming a metal pattern layer with a predetermined pattern on a support substrate;
   disposing a sacrificial layer on the support substrate and the metal pattern layer and disposing a flattening layer on the sacrificial layer;
   curing at least one portion of the flattening layer by irradiation with UV rays in a direction of a lower surface of the support substrate;
   disposing a stress buffer layer on the flattening layer, disposing a fabric layer on the stress buffer layer, and applying predetermined pressure in a direction of the fabric layer; and
   generating a fabric substrate in which the flattening layer, the stress buffer layer, and the fabric layer are sequentially stacked, by removing the sacrificial layer disposed between the support substrate and the flattening layer and selectively etching a portion of the flattening layer, in which UV curing is not caused, with a developer.
2. The manufacturing method of claim 1, further comprising:

removing a contaminant on a surface of the support substrate with a washing solution.

3. The manufacturing method of claim 1, wherein the sacrificial layer is formed of a material which is freely soluble in a solvent.

4. The manufacturing method of claim 1, wherein, in the disposing of the sacrificial layer, the sacrificial layer is stacked by a predetermined coating process, and the sacrificial layer is cured by being heated at a predetermined temperature for a predetermined time.

5. The manufacturing method of claim 1, wherein, in the disposing of the flattening layer, the flattening layer is stacked by a predetermined coating process, and the flattening layer is cured by being heated at a predetermined temperature for a predetermined time or by being irradiated with a UV ray having a predetermined wavelength for a predetermined time.

6. The manufacturing method of claim 1, further comprising:

hardening the stress buffer layer at room temperature for a predetermined time.

7. The manufacturing method of claim 1, wherein, in the generating of the fabric substrate, the sacrificial layer is removed by a predetermined solvent.

\* \* \* \* \*